US009006955B2

(12) United States Patent
Batchelder

(10) Patent No.: US 9,006,955 B2
(45) Date of Patent: Apr. 14, 2015

(54) HIGH-ENERGY BETA-PARTICLE SOURCE FOR BETAVOLTAIC POWER CONVERTER

(75) Inventor: Geoffrey D. Batchelder, Chandler, AZ (US)

(73) Assignee: Medtronic, Inc., Minneapolis, MN (US)

( * ) Notice: Subject to any disclaimer, the term of this patent is extended or adjusted under 35 U.S.C. 154(b) by 525 days.

(21) Appl. No.: 13/286,865

(22) Filed: Nov. 1, 2011

(65) Prior Publication Data

US 2012/0186637 A1     Jul. 26, 2012

Related U.S. Application Data

(60) Provisional application No. 61/434,629, filed on Jan. 20, 2011.

(51) Int. Cl.
| | | |
|---|---|---|
| H01L 31/18 | (2006.01) | |
| H01L 31/115 | (2006.01) | |
| H01L 31/068 | (2012.01) | |
| H01L 31/043 | (2014.01) | |
| G21H 1/06 | (2006.01) | |
| H01M 4/02 | (2006.01) | |

(52) U.S. Cl.
CPC ............... H01L 31/068 (2013.01); *G21H 1/06* (2013.01); *H01M 4/02* (2013.01); *Y02E 10/547* (2013.01); *H01L 2924/0002* (2013.01); H01L 31/043 (2013.01)

(58) Field of Classification Search
CPC ..... H01L 25/045; H01L 31/068; H01L 31/04; H01L 31/043; H01L 2924/0002; G21H 1/06; H01M 4/02; Y02E 10/547
USPC .............. 310/301, 303; 438/56; 136/202, 253
IPC .......................................... H01L 31/18, 31/115
See application file for complete search history.

(56) References Cited

U.S. PATENT DOCUMENTS

| | | | | |
|---|---|---|---|---|
| 2,819,414 A | * | 1/1958 | Sherwood et al. | ............ 310/303 |
| 3,706,893 A | | 12/1972 | Olsen et al. | |
| 3,836,798 A | | 9/1974 | Greatbatch | |
| 5,087,533 A | * | 2/1992 | Brown | ............................. 429/5 |
| 5,260,621 A | | 11/1993 | Little et al. | |

(Continued)

FOREIGN PATENT DOCUMENTS

| | | |
|---|---|---|
| DE | 1055144 B | 4/1959 |
| EP | 1958928 A1 | 8/2008 |

OTHER PUBLICATIONS

Office Action from U.S. Appl. No. 12/790,334, dated Jan. 11, 2013, 9 pp.

(Continued)

*Primary Examiner* — John K Kim
(74) *Attorney, Agent, or Firm* — Evans M. Mburu

(57) ABSTRACT

A power converter comprises a nuclear radiation emitter having a first side and a second side, wherein the nuclear radiation emitter comprises a radiation-emitting radioisotope, a plurality of semiconductor substrates disposed over the first side of the nuclear radiation emitter, wherein each of the plurality of semiconductor substrates comprises a junction for converting nuclear radiation particles to electrical energy, and at least one high-density layer, wherein the high density layer has a density that is higher than a density of the semiconductor substrates, and wherein the high-density layer is disposed between two of the plurality of semiconductor substrates.

18 Claims, 8 Drawing Sheets

(56) References Cited

U.S. PATENT DOCUMENTS

| | | | | |
|---|---|---|---|---|
| 5,859,484 | A | * | 1/1999 | Mannik et al. ............... 310/303 |
| 5,961,729 | A | | 10/1999 | Akari |
| 6,238,812 | B1 | * | 5/2001 | Brown et al. ..................... 429/5 |
| 6,479,919 | B1 | * | 11/2002 | Aselage et al. ............... 310/303 |
| 6,911,711 | B1 | | 6/2005 | Shimabukuro et al. |
| 7,663,288 | B2 | | 2/2010 | Chandrashekhar et al. |
| 7,727,882 | B1 | | 6/2010 | Wu et al. |
| 7,939,986 | B2 | | 5/2011 | Chandrashekhar et al. |
| 2004/0253815 | A1 | | 12/2004 | Sun et al. |
| 2007/0273244 | A1 | | 11/2007 | Lal et al. |
| 2011/0241144 | A1 | * | 10/2011 | Spencer et al. ............... 257/429 |
| 2011/0291210 | A1 | * | 12/2011 | Batchelder ................... 257/429 |
| 2012/0186637 | A1 | * | 7/2012 | Batchelder ................... 136/253 |

OTHER PUBLICATIONS

Response to Office Action dated May 31, 2012, from U.S. Appl. No. 12/790,334, filed Aug. 31, 2012, 18 pp.

Office Action from U.S. Appl. No. 12/790,334, dated Sep. 10, 2013, 11 pp.

Blanchard, et al., A Nuclear Microbattery for MEMS Devices, University of Wisconsin Madison, Final Scientific Technical Report. Jan. 2002, 10 pps.

Wacharasindhu et al., Liquid-Semiconductor-Based Micro Power Source Using Radioisotope Energy Conversion; Transducers 2009, Denver, CO, USA, Jun. 21-25, 2009; pp. 656-659.

Silicon Carbide—Boron High Aspect Ratio Pillared Betavoltaic Cell Technology Brief, Cornell University Center for Technology, Enterprise and Commercialization, 2005, 2 pp.

Tulenko et al., Final Technical Annual Report Project Period: Sep. 1, 2006-Aug. 31, 2007, Robotics Technology Development Program, University of Florida, College of Engineering, 2007, pp. 1-30.

Ulmen et al., Development of Diode Junction Nuclear Battery Using 63Ni, Journal of Radioanal Nucl. Chem. (2009) 282: pp. 601-604, Published online: Aug. 1, 2009.

Chandrashekhar, Demonstration of a 4H SiC Betavoltaic Cell: A Dissertation Presented to the Faculty of the Graduate School of Cornell University, Jan. 2007, 123 pp.

Honsberg et al., GaN Betavoltaic Energy Converters, Presented at 31st IEEE Photovoltaics Specialist Conference, Orlando, Florida, Jan. 3-7, 2005, 4 pp.

Duggirala et al., "3D Silicon Betavoltaics Microfabricated using a Self-Aligned Process for 5 Milliwatt/CC Average, 5 Year Lifetime Microbatteries," The 14th International Conference on Solid-State Sensors, Actuators and Microsystems, Lyon, France, Jun. 10-14, 2007, pp. 279-282.

Liu et al., "Betavoltaics using scandium tritide and contact potential difference," Applied Physics Letters, AIP, american Institute of Physics, vol. 92, No. 8, Feb. 29, 2008, pp. 083511-1-083511-3.

U.S. Appl. No. 12/790,334, by Geoffrey D. Batchelder, filed May 28, 2010.

Prutchi, "Nuclear Pacemakers," 2005, 8 pp., available at http://www.prutchi.com/pdf/implantable/nuclear_pacemaker.pdf. Applicant points out that the year of publication is sufficiently earlier than the effective U.S. filing date and any foreign priority date so that the particular month of publication is not in issued and, therefore, no month is required per MPEP 609.04(a)(1).

Response to office action dated Sep. 10, 2013 for U.S. Appl. No. 12/790,334, filed Jan. 10, 2014, 6 pages.

Office Action from U.S. Appl. No. 12/790,334, dated May 31, 2012, 11 pp.

Office Action from U.S. Appl. No. 12/790,334, dated Jul. 29, 2014, 10 pp.

Response to Office Action dated Jul. 29, 2014, from U.S. Appl. No. 12/790,334, filed Oct. 28, 2014, 5 pp.

\* cited by examiner

HIGH-ENERGY BETA-PARTICLE SOURCE FOR BETAVOLTAIC POWER CONVERTER

This application claims the benefit of U.S. Provisional Application No. 61/434,629, entitled, "HIGH-ENERGY BETA-PARTICLE SOURCE FOR BETAVOLTAIC POWER CONVERTER," and filed on Jan. 20, 2011, the entire content of which is incorporated herein by reference.

TECHNICAL FIELD

The disclosure relates to betavoltaic power cells.

BACKGROUND

Betavoltaic devices convert energy from a radioactive source that emits beta particles (high-energy electrons). A betavoltaic device converts the energy of the beta particles to electrical current by collecting electron-hole pairs that are formed by beta particles incident upon a semiconductor material of the betavoltaic device.

SUMMARY

In general, the present disclosure is directed to a power converter for converting nuclear radiation particles, such as beta particles, to electrical energy. The power converter of the present disclosure comprises a nuclear radiation emitting radioisotope having a relatively high energy spectrum and a structure for maximizing the potential to converter energy from the resulting high-energy nuclear radiation particles.

In one example, the disclosure is directed to a power converter comprising a nuclear radiation emitter having a first side and a second side, wherein the nuclear radiation emitter comprises a radiation-emitting radioisotope, a plurality of semiconductor substrates disposed over the first side of the nuclear radiation emitter, wherein each of the plurality of semiconductor substrates comprises a junction for converting nuclear radiation particles to electrical energy, and at least one high-density layer, wherein the high density layer has a density that is higher than a density of the semiconductor substrates, and wherein the high-density layer is disposed between two of the plurality of semiconductor substrates.

In another example, the disclosure is directed to a power converter comprising a beta emitter comprising a beta-emitting radioisotope, a filler disposed laterally around the beta emitter, and a pair of stacks, wherein a first one of the pair of stacks is disposed over a first side of the beta emitter and a first side of the filler and a second one of the pair of stacks disposed over a second side of the beta emitter. Each of the stacks comprises a moderating layer disposed over the beta emitter and the filler, a first high-density layer disposed over the moderating layer, wherein the first high-density layer has a density that is higher than a density of the moderating layer, a plurality of composite structures disposed over the first high-density layer, wherein each of the plurality of composite structures comprises a semiconductor substrate comprising a junction for converting nuclear radiation particles to electrical energy and a second high-density layer disposed on the semiconductor substrate, wherein each second high-density layer has a density that is higher than a density of the semiconductor substrate, an absorption layer disposed over the plurality of composite structures, and a third high-density layer disposed over the outer absorption layer, wherein the third high-density layer has a density that is higher than a density of the absorption layer.

In another example, the disclosure is directed to a method of making a power converter, the method comprising forming a plurality of semiconductor substrates over a first side of a nuclear radiation emitter, wherein the nuclear radiation emitter comprises a radiation-emitting radioisotope, and wherein each of the plurality of semiconductor substrates comprises a junction for converting nuclear radiation particles to electrical energy, and forming at least one high-density layer between two of the plurality of semiconductor substrates, wherein the at least one high-density layer has a density that is higher than a density of the semiconductor substrates.

In yet another example, the disclosure is directed to a method of making a power converter, the method comprising forming a filler laterally around a beta emitter, wherein the beta emitter comprises a beta-emitting radioisotope and forming a pair of stacks, wherein a first one of the pair of stacks is formed over a first side of the beta emitter and a first side of the filler and a second one of the pair of stacks is formed over a second side of the beta emitter. Forming each of the stacks comprises forming a moderating layer over the beta emitter and the filler, forming a first high-density layer over the moderating layer, wherein the first high-density layer has a density that is higher than a density of the moderating layer, forming a plurality of composite structures disposed over the first high-density layer, wherein forming each of the plurality of composite structures comprises forming a semiconductor substrate comprising a junction for converting nuclear radiation particles to electrical energy and forming a second high-density layer on the semiconductor substrate, wherein each second high-density layer has a density that is higher than a density of the semiconductor substrate, forming an absorption layer over the plurality of composite structures, and forming a third high-density layer disposed over the outer absorption layer, wherein the third high-density layer has a density that is higher than a density of the absorption layer The details of one or more examples are set forth in the accompanying drawings and the description below. Other features, objects, and advantages of the disclosure will be apparent from the description and drawings, and from the claims.

DETAILED DESCRIPTION

Figure 1:
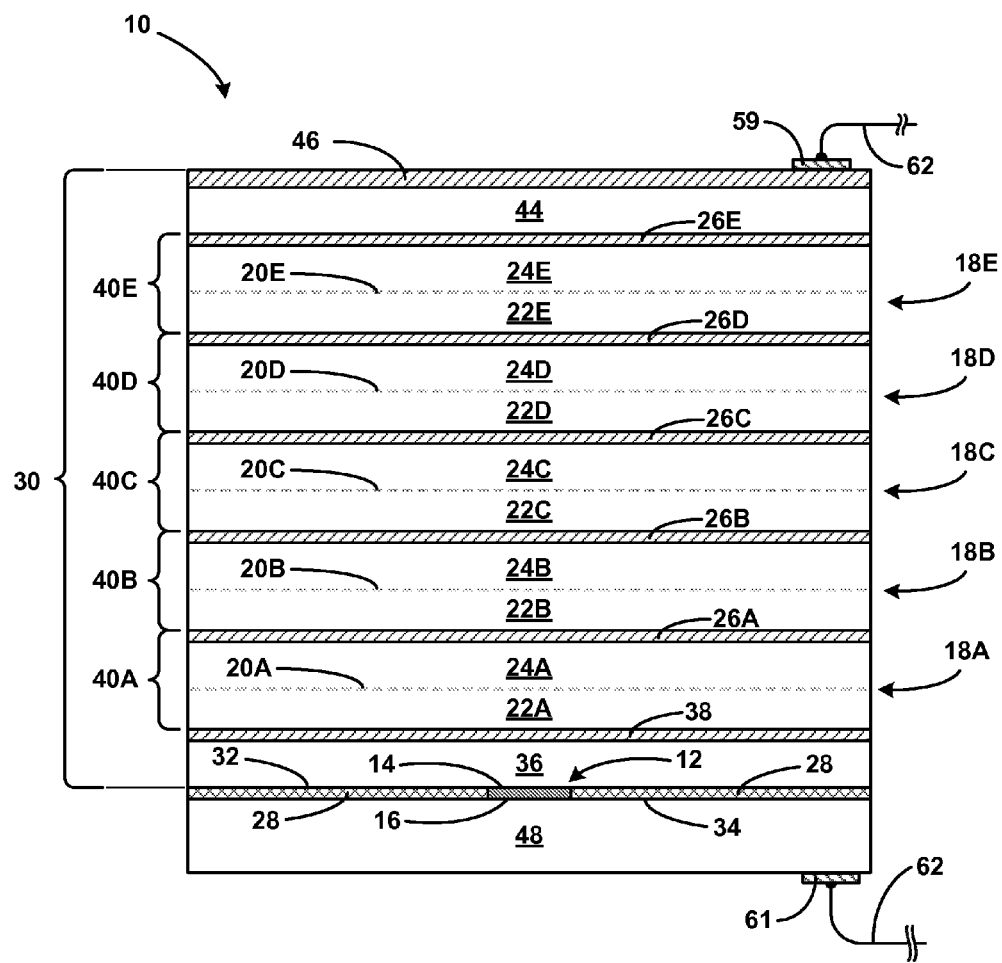
FIG. 1 is a schematic diagram of an example power converter.

In general, this disclosure is directed to a power converter for the conversion of nuclear energy, such as alpha particles or beta particles, to electrical energy. The power converter permits a relatively high-energy radiation source material to be used so that higher power density may be achieved while providing a structure that can contain high-energy nuclear particles within the converter. The ability to use a high-energy radiation source allows the power converter to have a smaller volume for the same power output, allowing the power converter to be used as a power source for small devices such as implantable sensor devices.

The power converter includes a material that emits nuclear radiation particles that are converted to electrical current by the power converter. The nuclear radiation-emitting material may emit alpha particles (a nuclear particle comprising two protons and two neutrons that is identical to the nucleus of a helium atom) via alpha decay or beta particles (a high-energy electron) via beta decay. Although the power converters described in the present disclosure may be configured to convert both alpha particles and beta particles to electrical current, the disclosure will focus on power converters for converting beta particles into electrical current, generally referred to as a "betavoltaic power converter." Energy from the beta particles may be converted by the betavoltaic device using a semiconductor substrate having a junction, such as a p-n diode junction, which collects electron-hole pairs that are created within the semiconductor as a result of interacting with beta particles.

Beta-emitting materials that have been used in betavoltaic devices include nickel-63 and tritium or compounds comprising tritium, such as scandium tritide (e.g. a scandium hydride, $ScH_2$, wherein an appreciable percentage of the hydrogen atoms are tritium). However, nickel-63 and tritium each have a relatively low energy spectrum of the beta particles that are emitted from the beta-emitting material, e.g., beta particles emitted from tritium have a maximum energy output $E_{Max}$ of about 0.018 MeV and an average energy output $E_{Avg}$ of about 0.006 MeV, beta particles emitted from nickel-63 have a maximum energy output $E_{Max}$ of about 0.067 MeV and an average energy output $E_{Avg}$ of about 0.0174 MeV. The relatively low energy outputs of nickel-63 and tritium, for example, are such that it may be difficult to achieve a desired power density for certain applications. For example, if the device being power by the power converter is particularly small, such as an implantable diagnostic sensor for the use in a patient, power converters using nickel-63, tritium, or other materials that emit low-energy beta particles may be unable to provide an adequate power without increasing the physical size of the power converter beyond that which may be practical for the application.

Beta-emitting materials having a beta particle energy output higher than nickel-63 and tritium are known. For example, beta particles emitted from strontium-90 have an average energy output of about 0.196 MeV (more than 10 times that of nickel-63). In addition, strontium-90 decays to another beta-emitting isotope, yttrium-90, which has a very short half life (about 64 hours), but which also emits beta particles having a relatively high average energy of about 0.93 MeV (more than 50 times that of nickel-63). Thus, strontium-90, and its decay byproduct yttrium-90, has the potential to provide much more energy than nickel-63 and tritium, thus allowing for higher energy densities. Moreover, strontium-90 has a higher activity than nickel-63, e.g. about 5050 GBq per gram versus 2190 GBq per gram for nickel-63 such that strontium-90 may provide for higher power as well. However, these high-energy beta-emitting materials also have a much higher maximum beta particle energy, e.g., strontium-90 has an $E_{Max}$ of about 0.545 MeV and yttrium-90 has an $E_{Max}$ of about 2.26 MeV, that can lead to crystal damage that may accrue over time in the semiconductor substrate that form the junctions. These higher-energy beta particles may have some potentially detrimental effects. First, the higher-energy beta particles may lead to faster degradation of the semiconductor materials used in power converters, such as through crystal damage that may accrue in semiconductor materials. Second, the higher-energy beta particles may also be more likely to create Bremsstrahlung (x-rays) resulting from deceleration of the beta electrons. Third, because the beta particles may be travelling at a higher energy, they may be more likely to exit the power converter before all the kinetic energy has been absorbed by the semiconductor substrate As described in more detail below, the power converters described in the present disclosure may alleviate or eliminates these detrimental effects.

FIG. 1 is a schematic view of an example power converter 10 in accordance with the present disclosure. Power converter 10 comprises a nuclear radiation emitter 12 comprising a first side 14 and a second side 16. In some examples, nuclear radiation emitter 12 comprises a radiation-emitting radioisotope having a relatively high-energy beta-ray spectrum. In one example, nuclear radiation emitter 12 of power converter 10 comprises a beta emitter 12 comprising a beta-emitting radioisotope having a relatively high-energy spectrum, such as strontium-90. Power converter 10 also comprises a plurality of semiconductor substrates 18A, 18B, 18C, 18D, 18E (collectively referred to herein as "semiconductor substrate(s) 18") disposed over first side 14 of nuclear radiation emitter 12. Each semiconductor substrate 18 comprises a junction 20 (e.g., junction 20A for semiconductor substrate 18A, junction 20B for semiconductor substrate 18B, and so on) for converting nuclear radiation particles to electrical energy. Each junction 20 may comprise a first side 22 (e.g., first side 22A for semiconductor substrate 18A, first side 22B for semiconductor substrate 18B, and so on) and a second side 24 (e.g., second side 24A for semiconductor substrate 18B, second side 24B for semiconductor substrate 18B, and so on). In some examples, each junction 20 comprises a P-N junction 20 within semiconductor substrate 18, wherein first side 22 is either a P side or an N side of the P-N junction 20 and second side 24 is the other of the P side or the N side. For the sake of simplicity, in the example of FIG. 1, first side 22 will be described as the P side 22 and second side 24 will be described as the N side 24 of a P-N junction 20 for each semiconductor substrate 18. However, sides 22, 24 may be reversed for some or all of semiconductor substrates 18, e.g. such that first side 22 is the N side and second side 24 is the P side.

Power converter 10 converts nuclear energy to electrical energy. For example, for a beta emitter 12 comprising a beta-emitting radioisotope, the beta-emitting radioisotope undergoes beta decay to emit beta particles. P-N junctions 20 convert the beta particles into electrical current by collecting electron-hole pairs that are formed in semiconductor substrates 18 by beta particles incident on semiconductor substrates 18, as described in more detail below.

Power converter 10 also comprises at least one high-density layer 26A, 26B, 26C, 26D, 26E (collectively referred to herein as "high-density layer(s) 26") that is disposed between two of the plurality of semiconductor substrates 18. The at least one high-density layer 26 has a density that is higher than a density of semiconductor substrates 18. In one example, shown in FIG. 1, the at least one high-density layer 26 of power converter 10 comprises a plurality of high-density layers 26 so that a high-density layer 26 is disposed on each of the plurality of semiconductor substrates 18.

In one example, power converter 10 comprises a beta emitter 12 comprising a beta-emitting radioisotope having a relatively high-energy beta-ray spectrum, e.g., an average energy output, $E_{Avg}$, of at least about 0.1 MeV, for example at least about 0.15 MeV, such as strontium-90, and a filler 28 disposed laterally around beta emitter 12. An energy-collecting stack 30 is disposed over a first side 14 of nuclear radiation emitter 12 and filler 28. In some examples, energy-collecting stack 30 comprises a moderating layer 36 disposed over beta emitter 12 and filler 28. A high-density layer 38 may be disposed over moderating layer 36, wherein high-density layer 38 has a density that is higher than a density of moderating layer 36. A plurality of composite structures 40A, 40B, 40C, 40D, 40E (collectively referred to herein as "composite structure(s) 40") may be disposed over high-density layer 38, wherein each composite structure 40 may comprise a semiconductor substrate 18 comprising a junction 20 for converting nuclear radiation particles to electrical energy and a high-density layer 26 disposed on semiconductor substrate 18. For example, composite structure 40A comprises semiconductor substrate 18A and high-density layer 26A disposed on semiconductor substrate 18A, and composite structure 40D comprises semiconductor substrate 18D and high-density layer 26D disposed on semiconductor substrate 18D. Each high-density layer 26 has a density that is higher than a density of semiconductor substrate 18 of composite structures 40. Stack 30 may also comprise an absorption layer 44 disposed over the plurality of composite structures 40. A high-density layer 46 may be disposed over absorption layer 44, wherein high-density layer 46 has a density that is higher than a density of absorption layer 44.

In some examples, power converter 10 may only comprise a plurality of semiconductor substrates 18 disposed over a first side 14 of nuclear radiation emitter 12, with a substrate 48 disposed over a second side 16 of nuclear radiation emitter 12, as shown in FIG. 1. In some examples, substrate 48 provides mechanical support for nuclear radiation emitter 12, filler, and stack 30. Substrate 48 may also provide a layer for the absorption of nuclear radiation particles that are emitted from nuclear radiation emitter 12 in the direction of second side 16, for example to prevent the release of the nuclear radiation particles into a patient in which power converter 10 is implanted. Substrate 48 may also absorb Bremsstrahlung (x-rays) resulting from the deceleration of beta particles from a beta emitter 12.

Figure 2:
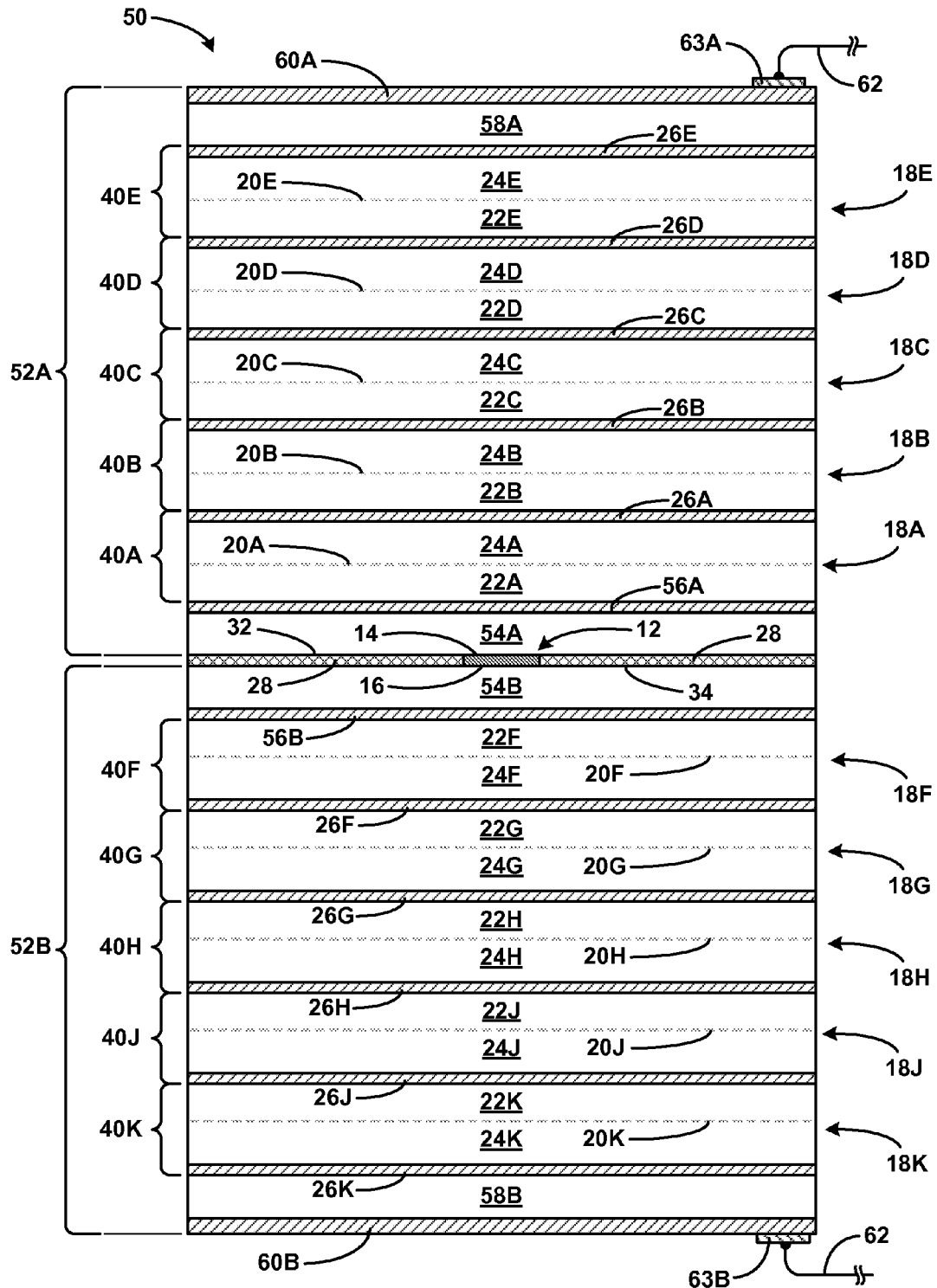
FIG. 2 is a schematic diagram of another example power converter.

In another example, shown in FIG. 2, a power converter 50 may comprise a plurality of semiconductor substrates 18 disposed on both a first side 14 and a second side 16 of nuclear radiation emitter 12. In the example of FIG. 2, power converter 50 comprises a beta emitter 12 comprising a beta-emitting radioisotope having a relatively high energy spectrum, for example with an average energy output, $E_{Avg}$, of at least about 0.1 MeV, such as about 0.15 MeV, for example strontium-90, and a filler 28 disposed laterally around beta emitter 12. A pair of stacks 52A, 52B (collectively referred to herein as "stack(s) 52") are disposed on either side 14, 16 of beta emitter 12 and filler 28 such that a first stack 30A of the pair of stacks is disposed over first side 14 of beta emitter 12 and a first side 32 of filler 28 and a second stack 30B of the pair of stacks is disposed over second side 16 of beta emitter 12 and second side 34 of filler 28. Each stack 52 may have generally the same configuration as stack 30 described above with respect to power converter 10 of FIG. 1.

In one example, each stack 52 may comprise a moderating layer 54 (e.g., stack 52A comprises moderating layer 54A and stack 52B comprises moderating layer 54B) disposed over beta emitter 12 and filler 28. A high-density layer 56 may be disposed over moderating layer 36 (e.g., high-density layer 56A disposed over moderating layer 54A and high-density layer 56B disposed over moderating layer 54B), wherein high-density layer 56 has a density that is higher than a density of moderating layer 54.

A plurality of composite structures 40A, 40B, 40C, 40D, 40E, 40F, 40G, 40H, 40J, 40K (collectively referred to herein as "composite structure(s) 40") may be disposed over high-density layer 38. In the example of FIG. 2, composite structures 40A, 40B, 40C, 40D, and 40E are disposed over high-density layer 56A of stack 52A and composite structures 40F, 40G, 40H, 40J, and 40K are disposed over high-density layer 56B of stack 52B. Each composite structure 40 comprises a semiconductor substrate 18 comprising a junction 20 for converting the kinetic energy of nuclear radiation particles to electrical energy and a high-density layer 26 disposed on semiconductor substrate 18. For example, composite structure 40A comprises semiconductor substrate 18A and high-density layer 26A disposed on semiconductor substrate 18A, and composite structure 40H comprises semiconductor substrate 18H and high-density layer 26H disposed on semiconductor substrate 18H. Each high-density layer 26 has a density that is higher than a density of the corresponding semiconductor substrate 18 of composite structures 40. Each stack 52 may also comprise an absorption layer 58 disposed over the plurality of composite structures 40 (e.g., absorption layer 58A of stack 52A and absorption layer 58B of stack 52B). A high-density layer 60 may be disposed over absorption layer 58 (e.g., high-density layer 60A disposed over absorption layer 58A and high-density layer 60B disposed over absorption layer 58B), wherein high-density layer 60 has a density that is higher than a density of absorption layer 58.

Each semiconductor substrate 18 may be electrically connected to a load, such as the circuitry of an implantable sensor device, such as via connection wires 62 (FIGS. 1 and 2). In FIG. 1, connection wires 62 are shown as being electrically connected to a bond pad 59 on high-density layer 46 and a bond pad 61 on substrate 48. In FIG. 2, connection wires 62 are shown as being electrically connected to bond pads 63A and 63B on high-density layers 60A and 60B, respectively. For simplicity, electrical connections, such as internal vias, between each semiconductor substrate 18 and bond pads 59, 61, 63 are not shown.

As described above, nuclear radiation emitter 12 of power converter 10, 50 comprises a nuclear radiation-emitting radioisotope that emits nuclear radiation particles as part of a nuclear decay radioisotope. In some examples, nuclear radiation emitter 12 is a beta emitter 12 comprising a beta-emitting radioisotope that emits beta particles as part of beta decay of the radioisotope. Beta particles emitted by beta emitter 12 enter semiconductor substrates 18, where some of the beta particles lose energy to the semiconductor material of semiconductor substrates 18. If the energy transferred from the beta particles to the semiconductor is sufficient, it will excite electrons within the semiconductor crystal lattice into the conduction band of semiconductor substrate 18, creating electron-hole pairs within the lattice. As described below, P-N junction 20 is configured to collect the electron-hole pairs to create electrical current.

The beta-emitting radioisotope of beta emitter 12 comprises a relatively high energy spectrum compared to, for example, the energy spectra of tritium ($E_{Max}$ of about 0.018 MeV; $E_{Avg}$ of about 0.006 MeV) and nickel-63 ($E_{Max}$ of about 0.067 MeV; $E_{Avg}$ of about 0.0174 MeV). In one example, the beta-emitting radioisotope of beta emitter 12 has an average energy output, $E_{Avg}$, of at least about 0.1 MeV, such as at least about 0.15 MeV. In one example, the beta-emitting radioisotope of beta emitter 12 comprises strontium-90 ($^{90}$Sr, half-life~27.7 years) that decays to another beta-emitting radio-isotope yttrium-90 ($^{90}$Y, half life of only about 64 hours).

As noted above, beta particles emitted from strontium-90/yttrim-90 have a higher energy output than tritium and nickel-63 ($^{90}$Sr beta particles have an $E_{Avg}$ of about 0.196 MeV; $^{90}$Y beta particles have an $E_{Avg}$ of about 0.93 MeV) such that power converter 10, 50 may provide for a larger power density than beta converters that only used nickel-63 and/or tritium as the beta emitting source. However, strontium-90/yttrim-90 also emits some beta particles that are substantially higher than the highest energy beta particles from nickel-63 or tritium ($^{90}$Sr beta particles have an $E_{Max}$ of about 0.545 MeV and $^{90}$Y beta particles have an $E_{Max}$ of about 2.26 MeV). These higher-energy beta particles may have some potentially detrimental effects. First, the higher-energy beta particles may lead to faster degradation of the semiconductor material of semiconductor substrates 18, such as through crystal damage that may accrue in semiconductor material, particularly when exposed to the highest energy beta particles (e.g. those having the energy of the $E_{Max}$). Second, the higher-energy beta particles may also be more likely to create Bremsstrahlung (x-rays) resulting from the deceleration of the beta electrons. Third, because the beta particles may be travelling at a higher energy, they may be more likely to exit the power converter before all the kinetic energy has been absorbed by the semiconductor substrate and collected by the P-N junctions as hole-electron pairs. Finally, it may be undesirable for higher energy beta particles to be permitted to exit the power converter without at least reducing the energy of those beta particles.

Power converter 10, 50 of the present disclosure alleviates or eliminates these detrimental effects by providing structure that may absorb some of the energy from the highest-energy beta particles so that they are less likely to damage semiconductor substrate 18. Power converter 10, 50 may also be configured to absorb Bremsstrahlung (x-rays). Power converter 10, 50 also provides a structure that tends to cause beta particles to be reflected or "backscattered" within the plurality of semiconductor substrates 18 so that the beta particles will be more likely to be absorbed semiconductor substrate 18 and their energy converted by junctions 20 rather than exiting power converter 10, 50 and being lost. Finally, power converter 10, 50 may also provide a structure that absorbs the majority of the remaining beta particles that are not absorbed by the stack of semiconductor substrates 18.

Filler 28 laterally surrounds nuclear radiation emitter 12 in order to isolate emitter 12. Filler 28 may comprise a material configured to absorb all or nearly all nuclear radiation particles that are emitted laterally from nuclear radiation emitter 12. In some examples, wherein nuclear radiation emitter 12 comprises an electrically conducting material, filler may comprise a dielectric material, such as silicon oxide, aluminum oxide, silicon nitride ($Si_3N_4$), or doped glasses. In some examples, metals may be used in filler 28, for example tungsten, copper, silver, gold, lead, nickel, germanium, iridium, osmium, and alloys thereof.

Moderating layer 36, 54 provides a layer of material that is proximate nuclear radiation emitter 12 in order to moderate some of the highest energy nuclear particles that are emitted in order to mitigate any potential damage to semiconductor substrates from the highest energy particles and to lower the likelihood of the beta particles escaping power converter 10, 50. For example, if nuclear radiation emitter 12 is a beta emitter that comprises strontium-90, moderating layer 36, 54 helps to reduce the energy of beta particles that are emitted near the $E_{Max}$ of strontium-90 of about 0.545 MeV. In one example, moderating layer 36, 54 may act to "truncate" the energy of any beta particles emitted from beta emitter 12 that have an energy above a predetermined threshold so that beta particles that exit moderating layer 36, 54 and pass into high-density layer 38, 56 have an energy below the predetermined threshold. In one example, moderating layer 36, 54 truncates the energy of beta particles having an energy above about 0.5 MeV, such as by truncating the energy of beta particles having an energy above about 0.45 MeV, for example by truncating the energy of beta particles having an energy above about 0.4 MeV. In some examples moderating layer 36, 54 comprises a semiconductor material or a dielectric material, such as silicon, silicon carbide, germanium, silicon oxide, silicon nitride, aluminum oxide, doped glasses, or ceramics. In one example, moderating layer 36, 54 comprises a silicon semiconductor.

Semiconductor substrates 18 each comprise a semiconductor material that is capable of being doped, for example to form P side 22 and N side 24. The semiconductor material that is used in semiconductor substrate 18 will depend on the desired power output from power converter 10, 50. As noted above, the power output depends in part on the energy output from the beta-emitting isotope that is used in beta emitter 12. However, properties of the semiconductor material can also affect the power output of the power converter. In particular, the band gap of the semiconductor material, as well as the built in potential of the junction and the source activity, limit the voltage that may be provided by each die. The resistance of the semiconductor material to breakdown from exposure to beta particles, or beta radiation hardness, may also be a consideration. Example semiconductor materials that may be used as semiconductor substrate 18 include silicon, silicon carbide, germanium, gallium arsenide, gallium nitride, and aluminum nitride. In one example, silicon carbide, such as 4H or α 6H silicon carbide, is used as the semiconductor material due to its band gap value of about 3 eV and because of its greater beta radiation hardness as compared to silicon.

Two or more semiconductor substrates 18 may be stacked in various combinations to achieve a desired voltage and current output for power converter 10, 50. In general, when two semiconductor substrates 18 are connected in parallel to form a parallel stack, the stack will output the same voltage as the individual semiconductor substrates 18, but the total output current that the combined semiconductor substrates 18 will equal the sum of the current produced by each die. Similarly, when two semiconductor substrates 18 are connected in series, the total current output will be equal to that of the individual semiconductor substrates 18, but the total voltage output will be equal to the sum of the voltage provided from each semiconductor substrate 18. The rules of adding voltages for series stacks and adding currents for parallel stacks can be used to create combinations of die stacks with the desired voltage and current output for a particular application. Examples of methods and configurations of connecting stacks of semiconductor substrates and/or dice is described in U.S. patent application Ser. No. 12/790,334 filed on May 28, 2010, entitled "Betavoltaic Power Converter Die Stacking," assigned to the assignee of this application, the entire disclosure of which is incorporated herein by reference.

Each semiconductor substrate 18 comprises a semiconductor structure that is configured to collect electron-hole pairs that are formed by beta particles incident on semiconductor substrate 18. As described above with respect to FIGS. 1 and 2, in one example, each semiconductor substrate 18 comprises a junction 20, such as a P-N junction 20, in order to collect electron-hole pairs. Beta particles emitted from beta emitter 12 are absorbed to various depths depending on the particle energy in materials, including the materials of beta emitter 12 and semiconductor substrate 18.

Junction 20 of each semiconductor substrate 18 provides for the conversion of beta particles incident on semiconductor substrate 18 from the beta-emitting radioisotope of beta emitter 12. As described in more detail below, beta particles generate electron-hole pairs in the semiconductor material of semiconductor substrates 18. These electron-hole pairs are collected by junctions 20 providing a flow of electrons from power converter 10, 50. As described below, in examples where junctions 20 are P-N diode junctions, the electron-hole pairs are collected because of the close proximity of P side 22 and N side 24 that forms each junction 20.

The terms "N doped" or "N type" as it is used in this disclosure with respect to a P-N junction refers to a semiconductor material that includes a dopant that provides for excess electrons to act as negative, or "N type," mobile charge carriers. In one example, an N type dopant donates one or more valence electrons to the semiconductor material of semiconductor substrate 18. Examples of dopants that are used for N type doping of group IV solids, such as silicon and germanium, include group V elements such as phosphorus, arsenic, or antimony. Examples of N type dopants that are used for 4H—SiC and 6H—SiC include nitrogen and phosphorus.

The term "P doped" or "P type" as it is used in this disclosure with respect to a P-N junction refers to a semiconductor material that includes a dopant that provides for excess holes to act as positive, or "P type," mobile charge carriers. In one example, a P type dopant accepts an electron from the semiconductor material of semiconductor substrate 52. Examples of dopants that are used for p type doping of group IV solids (silicon and germanium) include group IIIA elements such as boron or aluminum. Examples of P type dopants that are used for 4H—SiC and 6H—SiC include aluminum, boron, and gallium.

P side 22 and N side 24 of junction 20 may be formed by imbuing the appropriate portions of the semiconductor material of semiconductor substrate 18 with the appropriate type of dopant, e.g., P type dopant for P side 22 and N type dopant for N side 24. The dopant may be introduced to the semiconductor material by diffusion or ion implantation. P side 22 and N side 24 may also be formed by depositing the semiconductor material of each layer 22, 24 in the presence of the appropriate type of dopant, such as through chemical vapor deposition wherein the dopant is present in the deposition chamber. In one example, epitaxial deposition is performed in the presence of dopant in order to epitaxially grow each doped layer 22, 24 such that each layer will have the same monocrystalline orientation as the layer below it. In one example, P layer 22 may be deposited onto a substrate, such as a portion of semiconductor substrate 18, by epitaxial deposition of a semiconductor material in the presence of a P type dopant. N layer 24 may then be deposited onto P layer 22 by epitaxial deposition of a semiconductor material in the presence of a P type dopant. P layer 22 and N layer 24 may also be deposited in reverse order, e.g., with P layer 22 being deposited on N layer 24. Other deposition methods may be used to deposit P doped and N doped layers of semiconductor substrate 18, such as atomic layer epitaxy.

Junction 20 may be any semiconductor junction that provides for the collection of electron-hole pairs. In one example, junction 20 comprises a P-N junction formed within semiconductor substrate 18, wherein P side 22 is formed by a P type region of semiconductor material within semiconductor substrate 18 and N side 24 is formed by an N type region of semiconductor material within semiconductor substrate 18. The close proximity of the P type region of P side 22 and the N type region of N side 24 causes an electric field to develop at junction 20 that sweeps electrons in one direction and holes in the other (described in more detail below), providing for an electric current when the power converter is connected to a circuit.

In another example, the junction that provides for conversion of beta particle's energy to electron-hole pairs comprises a Schottky-barrier junction formed between semiconductor substrate 18 and a metal layer (not shown). Depending on the type of metal used to form the Schottky-barrier junction, the semiconductor material of semiconductor substrate 18 adjacent to the metal layer may be doped to be an N type semiconductor or a P type semiconductor. If semiconductor substrate 18 is doped with a P type dopant, then the semiconductor region of the Schottky-barrier junction forms P side of the junction, which may form the first side or the second side of the junction, while the metal layer applied to the P type semiconductor surface creates the Schottky-barrier at the semiconductor-metal interface, which forms the other of the first side or the second side. If semiconductor substrate 18 is doped with an N type dopant, then the semiconductor region of the Schottky-barrier junction forms N side of the junction, which may form the first side or the second side of the junction, while the metal layer applied to the N type semiconductor surface creates the Schottky-barrier at the semiconductor-metal interface, which forms the other of the first side or the second side. A work function difference between the metal layer and the doped semiconductor provides an electric field, similar to the field created in a P-N junction that provides for the collection of electron-hole pairs.

Although junction 20 may be formed by any structure that provides for the collection of electron-hole pairs formed by beta particles incident on semiconductor substrate 18, the remainder of the present disclosure will focus on the example of a P-N junction 20. Therefore, junction 20, as well as other junctions throughout the present disclosure, is referred to as "P-N junction." However, the use of terms describing junction 20, or any other junction, as a P-N junction is not meant to be limiting. For example, a Schottky-barrier junction may be used instead of a P-N junction without varying from the scope of the present disclosure.

The configuration of P-N junction 20 allows semiconductor substrate 18 to convert beta particle energy into electrical current. Because N side 24 comprises an excess of electron mobile charge carriers compared to P side 22, electrons diffuse across P-N junction 20 into P side 22. This leaves behind a positive donor ion in N side 24. Similarly, because P side 22 comprises an excess of hole mobile charge carriers compared to N side 24, holes diffuse across P-N junction 20 into N side 24. This leaves behind a negative donor ion in P side 22. Electrons that diffuse across P-N junction 20 into P side 22 may recombine with holes and be eliminated while holes that diffuse across P-N junction 20 into N side 24 may recombine with electrons and also be eliminated. The diffusion across P-N junction 20 and recombination of mobile charge carriers creates a zone on either side of P-N junction 20 where there are little to no mobile charge carriers available, referred to as the depletion zone, depletion region, or space charge region. The diffusion across P-N junction 20 and recombination of electrons and holes also creates an electrical imbalance, forming an electric field that counteracts further diffusion of electrons from N side 24 to P side 22 and of holes from P side 22 to N side 24.

When a beta particle impacts the semiconductor substrate 18 and energy of the beta particle is sufficient, it will excite electrons into the conduction band of semiconductor substrate 18, creating electron-hole pairs. Electrons formed on N side 24 of P-N junction 20 are generally prevented from crossing P-N junction 20 due to the electric field that is created in the depletion zone while the corresponding holes are swept across P-N junction 20 by the electric field. Electrons formed on P side 22 of P-N junction 20 are swept across P-N junction 20 by the electric field while the corresponding holes are prevented from crossing P-N junction 20 by the electric field. When semiconductor substrate 18 is connected to a load, electrons formed on N side 24 or that are swept across P-N junction 20 from P side 22 are swept via an anode through the circuit. The electrons that flow through the circuit then flow into P side 22 via a cathode, where they recombine with holes formed as part of the electron-hole pairs.

After semiconductor substrate 18 is complete, e.g., such that P-N junction 20 is formed, electrodes may be formed on semiconductor substrate 18 in order to form an electrical connection to P side 22 and N side 24. A first electrode is electrically connected to P side 22 and a second electrode is electrically connected to N side 24. In some examples, the high-density layers 26, 38 may comprise an electrically conducting material such that high-density layers 26, 38 form the electrodes of each semiconductor substrate 18. For example, high-density layer 38 is shown in FIG. 1 as being in contact with P side 22A of semiconductor substrate 18A while high-density layer 26A is shown as being in contact with N side 24A. In this example, high-density layer 38 is electrically connected to P side 22A and thus acts as a cathode of semiconductor substrate 18A, while high-density layer 26A is electrically connected to N side 24A and acts as an anode of semiconductor substrate 18A. Similarly, high-density layer 26A is shown as being in contact with P side 22B of semiconductor substrate 18B and high-density layer 26B is shown as being in contact with N side 24B of semiconductor substrate 18B such that high-density layer 26A acts as an cathode of semiconductor substrate 18B and high-density layer 26B acts as an anode of semiconductor substrate 18B. In such an arrangement, semiconductor substrate 18A and semiconductor substrate 18B are connected in series.

The electrodes may be electrically connected to P side 22 and N side 24 by ohmic contact between P side 22/N side 24 and the respective electrode. In other examples, the electrodes may be electrically connected to P side 22 or N side 24 via a seed metal deposited on P side 22 or N side 24 with the respective electrode deposited on the seed metal.

In other examples, intermediate layers may be deposited between layers that are shown as being in contact in FIG. 1. For example, an electrical insulation layer may be formed between semiconductor substrate 18A and high-density layer 38 or between semiconductor substrate 18A and high-density layer 26A (not shown). Also, each high-density layer 26 that is shown as a single layer in FIG. 1 may actual comprise a plurality of high-density layers 26 with or without intermediate layers, such as an electrical insulation layer, between pairs of the plurality of high-density layers 26.

High-density layers 26 of composite structures 40 each have a density that is higher than the density of semiconductor substrates 18. As beta particles emitted from beta emitter 12 pass through power converter 10, 50 they encounter boundaries or transitions between materials having different densities. The transitions from a first material having a first density to a second material having a second, different density causes some beta particles to be reflected back, or "backscattered." In general, when beta particles transition from a material having a lower density to a material having a higher density, a relatively larger percentage of the beta particles are backscattered compared to when beta particles transition from a material having a higher density to a material having a lower density. For this reason, in some examples, power converter 10, 50 may be configured to provide as many transitions from low-density materials to higher-density materials as is practical within the desired size constraints of power converter 10, 50.

Figure 3:
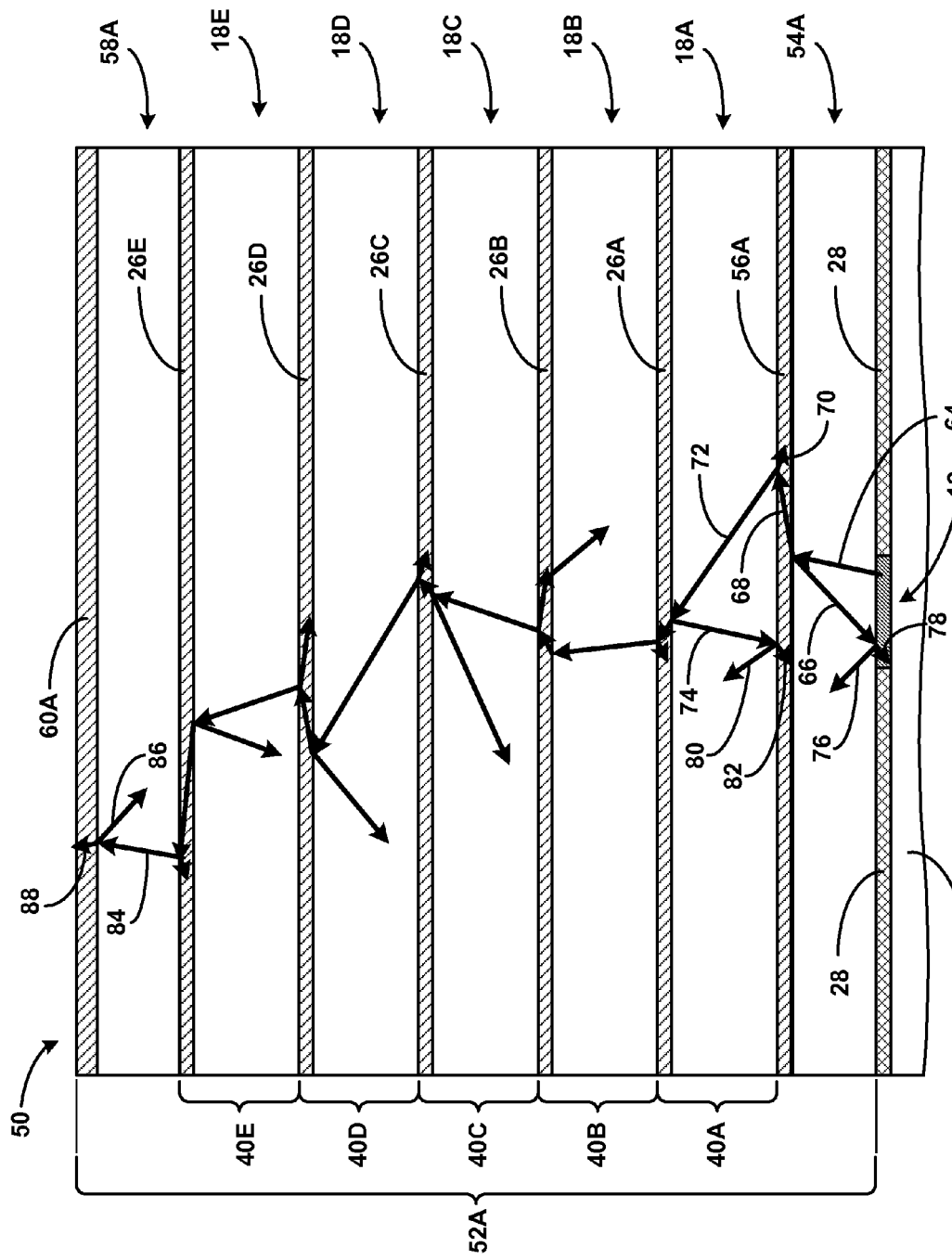
FIG. 3 is a conceptual diagram showing example paths of nuclear particles passing through the example power converter of FIG. 2.

A conceptual representation of backscattering of beta particles in a power converter is shown in FIG. 3. FIG. 3 shows beta-particle backscattering in example converter 50 (FIG. 2), but the same concepts may apply to other power converters disclosed in the present disclosure. In FIG. 3, a beta flux vector 64 indicates the direction of travel of a particular group of beta particles that are emitted from beta emitter 12 in generally the same direction. Beta flux vector 64 travels through moderating layer 54A until it encounters the interface between moderating layer 54A and high-density layer 56A disposed on moderating layer 54A. The difference in density between high-density layer 56A and moderating layer 54A causes some of beta particles of beta flux vector 64 to be backscattered. As shown in FIG. 3, beta flux vector 64 is "split" into beta flux vector 66 and beta flux vector 68, wherein beta flux vector 66 represents the beta particles of beta flux vector 64 that are backscattered back into moderating layer 54A and beta flux vector 68 represents the beta particles that continue into high-density layer 56A.

Beta flux vector 68 continues through high-density layer 56A until it encounters the interface between high-density layer 56A and semiconductor substrate 18A. Once again, the difference in densities causes some of the beta particles of beta flux vector 68 to backscatter so that beta flux vector 68 is split into beta flux vector 70 (beta particles that are backscattered back into high-density layer 56A) and beta flux vector 72 (beta particles that continue into semiconductor substrate 18A). However, because the transition from high-density layer 56A to semiconductor substrate 18A involves a transition from higher density to lower density, a smaller percentage of beta flux vector 68 will be backscattered compared to the percentage of beta flux vector 64 that was backscattered into beta flux vector 66 due to the transition from moderating layer 54 to high-density layer 56. Beta flux vector 72 continues through semiconductor substrate 18A until it encounters the interface between semiconductor substrate 18A and high-density layer 26A, where some of the beta particles are backscattered as beta flux vector 74.

Backscattered beta particles may continue through a substance until reaching an interface so that the backscattered beta particles may be "re-backscattered" back into the same material that they were backscattered into in the first place. For example, as shown in FIG. 3, beta flux vector 66, which resulted from the backscattering of some of beta flux vector 64, may encounter the interface between moderating layer 54A and beta emitter 12. Since the beta-emitting radioisotope, for example strontium-90 (density of about 2.64 g/cm$^3$), may have a different density than the material of moderating layer 54A, for example silicon (density of about 2.33 g/cm$^3$), beta flux vector 66 may itself be split into beta flux vector 76 that is backscattered back into moderating layer 54A and beta flux vector 78 that continues into beta emitter 12. Similarly, beta flux vector 74, which resulted from the backscattering of some of beta flux vector 72, may encounter the interface between semiconductor substrate 18A and high-density layer 56A. The transition from semiconductor substrate 18A to high-density layer 56A causes beta flux vector 74 to split into beta flux vector 80 that is backscattered back into semiconductor substrate 18A and beta flux vector 82 that continues into high-density layer 56A.

The beta particles that correspond to beta flux vector 72 may continue on throughout stack 52A, as shown by the additional beta flux vectors shown in FIG. 3, until finally a beta flux vector 84 that is passing through absorption layer 58A encounters the interface between absorption layer 58A and outer high-density layer 60A. This final transition from the relatively low-density material of absorption layer 58A to the relatively high-density material of high-density layer 60A provides a final means of redirecting beta particles back into power converter 50 such that the interface backscatters some of beta flux vector 84 into beta flux vector 86, while the remainder of beta particles exit power converter 50 as represented by beta flux vector 88.

The example beta particle paths described above with respect to beta flux vectors 64, 66, 68, 70, 72, 74, 76, 78, 80, 82, 84, 86, and 88 are merely illustrative of a possible path for beta particles through power converter 50. For example, although only a single beta flux vector 64 is shown being emitted in a single direction from beta emitter 12, beta particles may actually be emitted from beta emitter 12 in all directions such that an infinite number of beta flux vectors could have been shown, each encountering transitions between moderating layer 54A and high-density layer 56A at any one of an infinite number of points along the interface between moderating layer 54A and high-density layer 56A. Moreover, although each backscattering event only shows a beta flux vector being "split" into two resulting beta flux vectors, in reality beta particles may be backscattered back or continue through the interface in an infinite number of ways. For example, although beta flux vector 74 is shown in FIG. 3 as splitting into beta flux vector 80 that is backscattered into semiconductor substrate 18A and beta flux vector 82 that continues into high-density layer 56A, an infinite number of backscatter beta flux vectors or continuing beta flux vectors are possible.

Backscattering of beta particles, such as those represented by beta flux vectors 66, 74, 76, and 80, allows power converter 10, 50 to redirect beta particles that may otherwise have exited power converter 10, 50. The redirected beta particles are thus given another chance to deposit energy into a semiconductor substrate 18 permitting that energy to undergo conversion to electrical energy by P-N junction 20 collecting electron-hole pairs formed by the energy absorption. For example, beta flux vector 72 shown in FIG. 3 is shown as passing through semiconductor substrate 18A, where some of the beta particles represented by beta flux vector 72 will inevitably deposit energy into the semiconductor material of semiconductor substrate 18A and some of that energy will be collected and be converted into electrical energy by junction 20. However, many beta particles would reach the boundary of semiconductor substrate 18A such that if the beta particles are permitted to leave semiconductor substrate 18A then semiconductor substrate 18A will be unable to convert any energy from the exiting beta particles. But, because power converter 50 is configured to provide backscattering, at least some of the beta particles may be backscattered or reflected back into semiconductor substrate 18A, as represented by beta flux vector 74, where the backscattered beta particles may continue to be absorbed and converted to electrical energy. By stacking a plurality of semiconductor substrates 18 and creating transitions from low-density materials to high-density materials, the backscattering within each semiconductor substrate 18 can lead to a large percentage of beta particles remaining in power converter 10, 50 where part of their energy may potentially be collected by junctions 20 in semiconductor substrate 18.

In one example, wherein power converter 10, 50 comprises a plurality of semiconductor substrates 18A, 18B, 18C, 18D, 18E with a high-density layer 26A, 26B, 26C, 26D, 26E disposed on each semiconductor substrate 18, power converter 10, 50 may permit for backscattering and potential absorption of at least about 95% of the beta particles emitted from beta emitter in the direction of semiconductor substrates 18A, 18B, 18C, 18D, 18E (e.g. upwards in FIG. 3).

As noted above, the percentage of beta particles that are backscattered at a transition from one material to another is related to the difference between the density of the material from which the beta particles are leaving and the density of the material into which the beta particles are entering. In general, a larger percentage of beta particles are backscattered if the transition is from a material of lower density to a material of higher density, as compared to a transition from a material of higher density to a material of lower density. Moreover, in general, the larger the difference in densities in this low-density-to-high-density transition, the larger the percentage of beta particles that are backscattered. In particular, it is desirable to maximize the backscattering percentage of beta particles that are travelling from a semiconductor substrate 18 such that, in some examples, a substantial percentage of beta particles will continue to "bounce around" within a particular semiconductor substrate 18 until their energy is absorbed by the semiconductor material and potentially converted by P-N junction 20 into electrical energy. Therefore, the materials that are used for high-density layers 26, 38, 46, 56, and 60 preferably have as high of a density as is practical. In some example, the high-density materials of high-density layers 26, 38, 46, 56, and 60 have a density that is between about 150% and about 1000% of the density of the lower density material that it is adjacent to (e.g. so that the higher density material is between about 1.5 and about 10 times more dense than the lower density material), for example the materials of semiconductor substrates 18, moderating layers 36, 54, and absorption layers 44, 58. In some examples, the density of the higher density material is between about 200% and about 850% of the density of the lower density material that it is adjacent to (e.g. so that the higher density material is between about 2 and about 8.5 times more dense than the lower density material), for example between about 600% and about 825% of the density of the lower density material (e.g., so that the higher density material is between about 6 and about 8.25 times more dense than the lower density material). In some examples, each high-density layer 26, 38, 46, 56, 60 comprises at least one of tungsten (density of about 19.25 g/cm$^3$), copper (density of about 8.94 g/cm$^3$), nickel (density of about 8.91 g/cm$^3$), germanium (density of about 5.32 g/cm$^3$), gold (density of about 19.3 g/cm$^3$), silver (density of about 10.5 g/cm$^3$), platinum (density of about 21.45 g/cm$^3$), lead (density of about 11.3 g/cm$^3$), iridium (density of about 22.4 g/cm$^3$), and osmium (density of about 22.6 g/cm$^3$), and alloys thereof.

As noted above, semiconductor substrates 18 may comprise a semiconductor material such as silicon (density of about 2.33 g/cm$^3$), silicon carbide (density of about 3.21 g/cm$^3$), germanium (density of about 5.32 g/cm$^3$), gallium arsenide (density of about 5.32 g/cm$^3$), and gallium nitride (density of about 6.1 gm/cm$^3$). In one example, moderating layers 36, 54 and absorption layers 44, 58 comprise silicon, semiconductor layers 18 comprise silicon carbide, and all high-density layers 26, 56, and 60 comprise tungsten. In such an example, the transitions from the silicon moderating layers 36, 54 or absorption layers 44, 58 to the tungsten high-density layers 56, 60 comprise a change in density of about 826% (e.g., tungsten is about 8.26 times more dense than silicon), and the transitions from the silicon carbide semiconductor substrates 18 to the tungsten high-density layers 26 comprise a change in density of about 599% (e.g., tungsten is about 5.99 times more dense than silicon carbide).

In another example, described in more detail below, one or more of the high-density layers may comprise nickel-63 (density of about 8.91 g/cm$^3$) to provide a supplemental energy source in the form of a low-energy beta-emitting radioisotope. Therefore, in some examples, the transitions from the silicon moderating layers 36, 54 or absorption layers 44, 58 to the nickel-63 high-density layers comprise a change in density of about 382% (e.g., nickel-63 is about 3.82 times more dense than silicon), and the transitions from the silicon carbide semiconductor substrates 18 to the nickel-63 high-density layers comprises a change in density of about 276% (e.g., nickel-63 is about 2.76 times more dense than silicon carbide).

Figure 4:
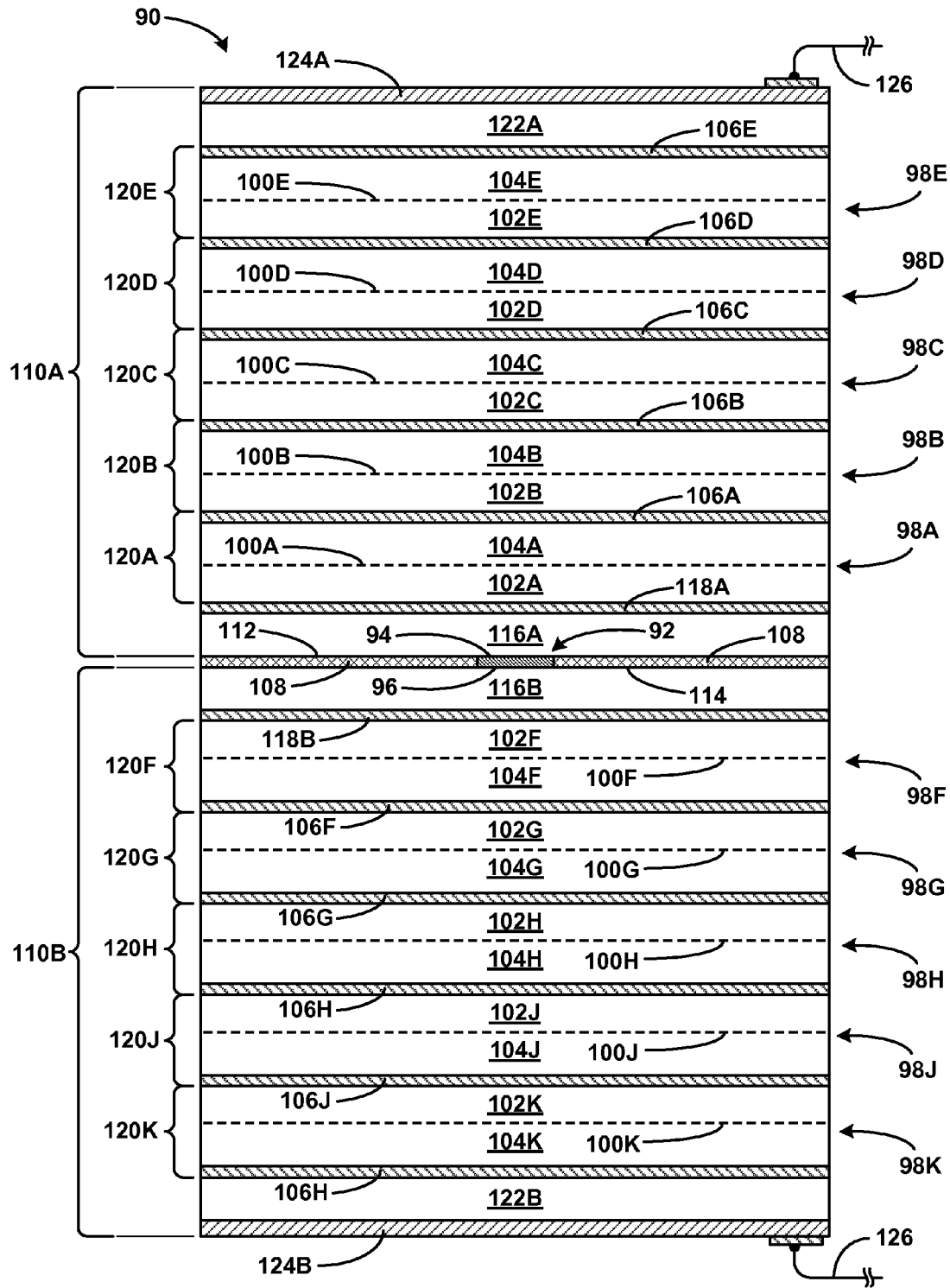
FIG. 4 is a schematic diagram of another example power converter.

In one example, a power converter may be provided that not only is configured to backscatter higher-energy nuclear particles that are emitted from a nuclear radiation emitter, but also may be configured to provide additional nuclear energy in the form of low-energy nuclear radiation emitting materials. FIG. 4 shows a cross section of an example power converter 90 that provides both a high-energy nuclear emitter 92 and also provides one or more low-energy nuclear emitters to supplement the energy provided by high-energy nuclear emitter 92. Power converter 90 of FIG. 4 is similar to power converter 50 in many respects. For example, power converter 90 comprises a nuclear radiation emitter 92 (similar to nuclear radiation emitter 12 of power converter 50) and a plurality of semiconductor substrates 98A, 98B, 98C, 98D, 98E, 98F, 98G, 98H, 98J, 98K (collectively referred to herein as "semiconductor substrate(s) 98") disposed over nuclear radiation emitter 92 (similar to semiconductor substrates 18 of power converter 50), wherein semiconductor substrates 98 each comprise a junction 100 for converting nuclear particle radiation into electrical energy, wherein each junction 100 comprises a first side 102 and a second side 104. In some examples, each junction 100 comprises a P-N junction 100 wherein first side 102 is either a P side or an N side of the P-N junction 100 and second side 104 is the other of the P side or the N side. For the sake of simplicity, first side 102 will be described as the P side 102 and second side 104 will be described as the N side 104 of a P-N junction 100 for each semiconductor substrate 98. However, sides 102, 104 may be reversed for some or all of semiconductor substrates 98, e.g., such that first side 102 is the N side and second side 104 is the P side.

Power converter 90 may also comprise at least one high-density layer 106A, 106B, 106C, 106D, 106E, 106F, 106G, 106H, 106J, 106K (collectively referred to herein as "high-density layer(s) 106") that is disposed between two of the plurality of semiconductor substrates 98 (where high-density layers 106 perform the same function as high-density layers 26 of power converter 50, e.g., to promote backscattering of beta particles). Power converter 90 also comprises a filler 108 disposed laterally around beta emitter 92 (similar to filler 28 of power converter 50), a moderating layer 116A, 116B disposed on either side of beta emitter 92 and filler 108 (similar to moderating layers 54 of power converter 50), a high-density layer 118A, 118B disposed over moderating layers 116 (similar to high-density layers 56 of power converter 50), an absorption layer 122A, 122B (similar to absorption layers 58 of power converter 50), and a high-density layer 124A, 12B disposed over absorption layers 122 (similar to high-density layers 60 of power converter 50). Power converter 90 may also be connected to an external load via connection wires 126 (similar to connection wires 62 of power converter 50).

The primary difference between power converter 50 shown in FIG. 2 and power converter 90 shown in FIG. 4 is that in power converter 50, high-density layers 26, 56, and 60 are only configured so that the high-density material will promote backscattering of beta particles. While backscattering is still a goal, power converter 90 also comprises at least one additional structure that comprises a second nuclear radiation emitting radioisotope having a lower energy spectrum than the nuclear radiation emitting radioisotope of nuclear radiation emitter 92. In some examples, at least one of high-density layers 106 and 118 comprises the low-energy nuclear radiation emitting radioisotope. High-density layers 124 could also comprise the low-energy nuclear radiation emitting radioisotope, however since absorption layers 122 may not be configured to include a junction for the conversion of nuclear energy to electrical energy, it may be impractical to include a low-energy nuclear radiation emitting radioisotope in layer 124 because the nuclear particles may be absorbed in absorption layer 122 before the particles can reach a junction 100 capable of converting their energy. Also, because high-density layers 124 are on an outer portion of power converter 90, half of the nuclear particles emitted from layers 124 would be lost because they would be emitted away from junctions 100.

As described above, in some examples nuclear radiation emitter 92 comprises a high-energy beta-emitting radioisotope, such as a beta emitting radioisotope having a average energy output, $E_{Avg}$, of at least about 0.1 MeV, for example at least about 0.15 MeV, such as strontium-90. In such an example, the low-energy nuclear radiation emitting radioisotope of at least one of high-density layers 106 or 118 may comprise a beta-emitting radioisotope having a lower energy spectrum than the high-energy beta-emitting radioisotope of emitter 92, for example a beta-emitting radioisotope having an average particle energy output, $E_{Avg}$, of less than about 0.1 MeV, such as an $E_{Avg}$ of less than about 0.05 MeV, for example an $E_{Avg}$ of less than about 0.02 MeV. In one example, the beta-emitting radioisotope of the at least one high-density layer 106 or 118 comprises nickel-63, tritium, or a compound comprising nickel-63 or a compound comprising tritium, such as scandium tritide.

In one example, two or more of high-density layers 106 comprises the low-energy nuclear radiation emitting radioisotope, such as a low-energy beta emitting radioisotope. For example, in the structure shown in FIG. 4, wherein there are five semiconductor substrates 98 on each side of nuclear radiation emitter 92, the two most middle high-density layers, e.g. high-density layers 106B and 106C, may comprise a low-energy beta emitting radioisotope, such as nickel-63 or scandium tritide. The high-density layers comprising a low-energy beta emitting radioisotope may be spaced from one another, such as an example wherein high-density layers 106A and 106D comprise a low-energy beta emitting radioisotope. In another example, three of the high-density layers 106, 118 may comprise a low-energy beta emitting radioisotope, such as the middle three high-density layers 106B, 106C, and 106D. In another example, four of the high-density layers 106, 118 may comprise a low-energy beta emitting radioisotope, such as the four middle high-density layers 106A, 106B, 106C, and 106D. In another example, each of the plurality of high-density layers 106 comprises a low-energy beta emitting radioisotope, such as nickel-63 or scandium tritide. In yet another example, each of the plurality of high-density layers 106 and each of high-density layers 118A and 118B all comprise a low-energy beta emitting radioisotope, such as nickel-63 or scandium tritide.

In the example shown in FIG. 4, power converter 90 comprises a beta emitter 92 comprising a beta-emitting radioisotope having a high-energy spectrum, also referred to as a "high-energy beta-emitting radioisotope," such as strontium-90, and a filler 108 disposed laterally around high-energy beta emitter 92. A pair of stacks 110A, 110B (collectively referred to herein as "stack(s) 110") are disposed on either side 94, 96 of high-energy beta emitter 92 and on either side 112, 114 of filler 108 such that a first stack 110A of the pair of stacks is disposed over first side 94 of high-energy beta emitter 92 and a first side 112 of filler 108 and a second stack 110B of the pair of stacks is disposed over second side 96 of high-energy beta emitter 92 and second side 114 of filler 108. In one example, each stack 110 may comprise a moderating layer 116 (e.g., stack 110A comprises moderating layer 116A and stack 110B comprises moderating layer 116B) disposed over high-energy beta emitter 92 and filler 108. A high-density layer 118 may disposed over moderating layer 116 (e.g., high-density layer 118A disposed over moderating layer 116A and high-density layer 118B disposed over moderating layer 116B), wherein high-density layer 118 has a density that is higher than a density of moderating layer 116. In some examples, high-density layers 118 also comprise a beta-emitting radio isotope having an energy spectrum lower than that of the high-energy beta-emitting radioisotope of beta emitter 92, also referred to as a "low-energy beta-emitting radioisotope," such as nickel-63 or scandium tritide.

Power converter 90 may also comprise a plurality of composite structures 120A, 120B, 120C, 120D, 120E, 120F, 120G, 120H, 120J, 120K (collectively referred to herein as "composite structure(s) 120") disposed over high-density layer 118. In the example of FIG. 4, composite structures 120A, 120B, 120C, 120D, and 120E are disposed over high-density layer 118A of stack 110A and composite structures 120F, 120G, 120H, 120J, and 120K are disposed over high-density layer 118B of stack 110B. Each composite structure 120 may comprise a semiconductor substrate 98 comprising a junction 100 for converting nuclear radiation particles to electrical energy and a high-density layer 106 disposed on semiconductor substrate 98. For example, composite structure 120A comprises semiconductor substrate 98A and high-density layer 106A disposed on semiconductor substrate 98A, and composite structure 120G comprises semiconductor substrate 98G and high-density layer 106G disposed on semiconductor substrate 98G. Each high-density layer 106 has a density that is higher than a density of semiconductor substrate 98. In some examples, each high-density layer 106 comprises a beta-emitting radioisotope having an energy spectrum lower than that of the high-energy beta-emitting radioisotope of beta emitter 92, also referred to as a "low-energy beta-emitting radioisotope," such as nickel-63 or scandium tritide. Each stack 110 may also comprise an absorption layer 122 disposed over the plurality of composite structures 120 (e.g., absorption layer 122A of stack 110A and absorption layer 122B of stack 110B). A high-density layer 124 may be disposed over absorption layer 122 (e.g., high-density layer 124A disposed over absorption layer 122A and high-density layer 124B disposed over absorption layer 122B), wherein high-density layer 118 has a density that is higher than a density of absorption layer 122.

Figure 5:
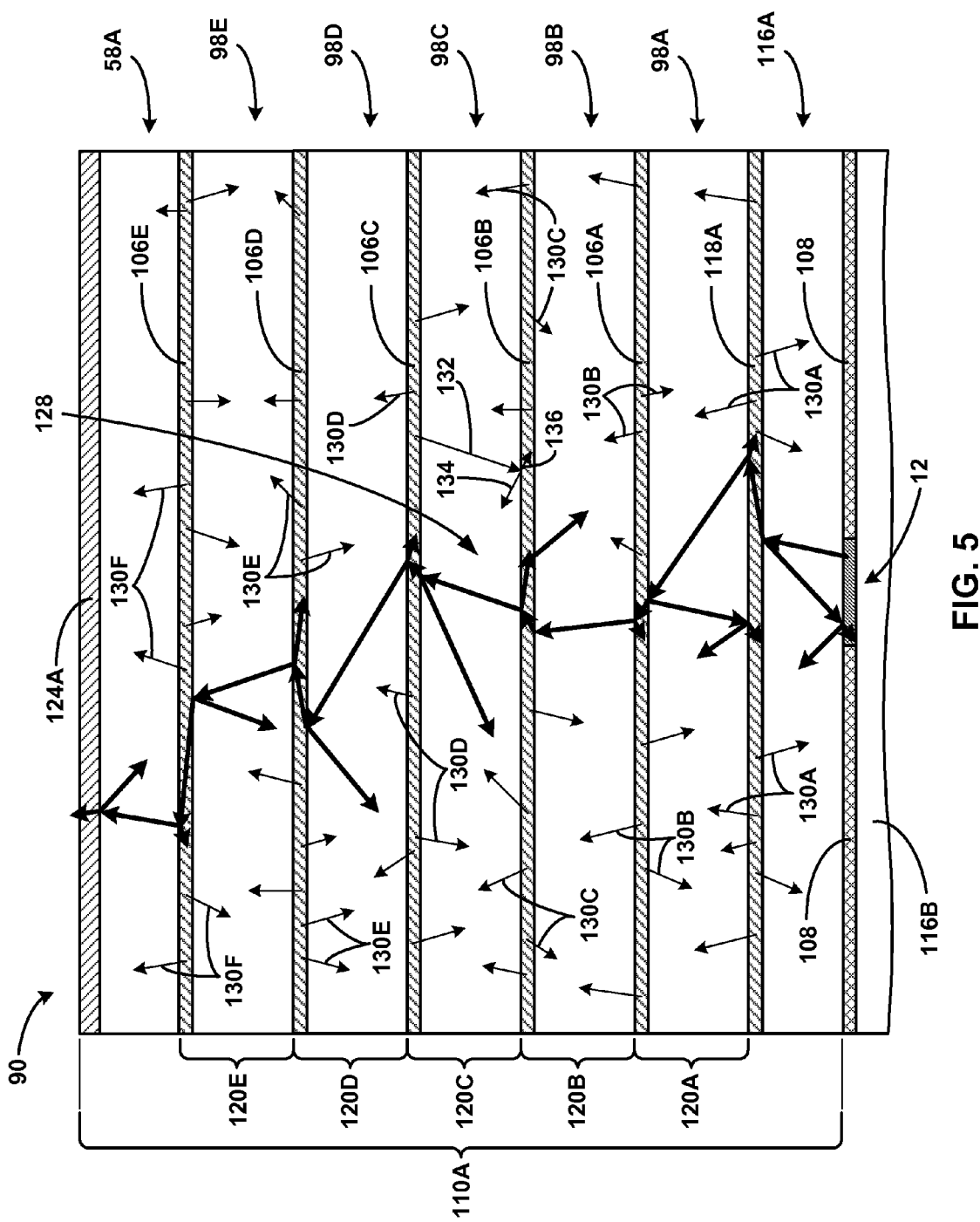
FIG. 5 is a conceptual diagram showing example paths of nuclear particles passing through the example power converter of FIG. 4.

FIG. 5 shows a conceptual representation of potential paths of travel for beta particles in the example power converter 90 of FIG. 4. As with power converter 50, shown in FIG. 3, power converter 90 also provides for backscattering of high-energy beta particles, as represented by beta flux vectors 128, which correspond to beta flux vectors 64, 66, 68, 70, 72, 74, 76, 78, 80, 82, 84, 86, and 88 et al. described above with respect to FIG. 3. However, as described above, at least one of the high-density layers 106, 118, or 124 may comprise a nuclear radiation-emitting radioisotope having a lower energy spectrum than that of the nuclear radiation-emitting radioisotope of nuclear radiation emitter 92 such that the at least one of the high-density layers 106, 118, or 124 also emits nuclear particles, although the nuclear particles emitted from the at least one high-density layers 106, 118, or 124 will generally have a lower energy than the nuclear particles emitted from nuclear radiation emitter 92. As described above, in one example nuclear radiation emitter 92 comprises a high-energy beta-emitting radioisotope, such as strontium-90, and the at one high-density layers 106, 118, or 124 may comprise a low-energy beta-emitting radisotope, for example nickel-63, tritium, a compound comprising nickel-63, or a compound comprising tritium, such as scandium tritide. In some examples, the low-energy beta-emitting radioisotope is included in one or more of high-density layers 106. In another example, the low-energy beta-emitting radioisotope is included in all of high-density layers 106.

In yet another example, shown in FIG. 5, the low-energy beta-emitting radioisotope is included in all high-density layers 106 and in high-density layers 118. As shown in FIG. 5, low-energy beta flux vectors 130A, 130B, 130C, 130D, 130E, 130F (collectively referred to herein as "beta flux vector(s) 130") are emitted from high-density layers 106 and 118. The lower energy spectra of beta flux vectors 130 compared to the energy spectra of beta flux vectors 128 emitted from beta emitter 92 are shown conceptually in FIG. 5 by the thinner line weight and shorter paths of beta flux vectors 130 compared to that of beta flux vectors 128. In the example of FIG. 5, beta flux vectors 130A represent the low-energy beta particles emitted from high-density layer 118A, beta flux vectors 130B represent the low-energy beta particles emitted from high-density layer 106A, beta flux vectors 130C represent the low-energy beta particles emitted from high-density layer 106B, beta flux vectors 130D represent the low-energy beta particles emitted from high-density layer 106C, beta flux vectors 130E represent the low-energy beta particles emitted from high-density layer 106D, and beta flux vectors 130F represent the low-energy beta particles emitted from high-density layer 106E. In some examples, the beta particles represented by beta flux vectors 130 have an energy that is low enough that the low-energy beta particles are absorbed by semiconductor substrates 98, moderating layer 116, or absorption layer 122 before they reach a interface between the lower density materials of semiconductor substrates 98, moderating layer 116, or absorption layer 122 and a high-density layer 106, 118, or 124. In such a scenario, backscattering of the beta particles represented by beta flux vectors 130 may be unlikely to occur. However, some beta particles emitted from the low-energy beta-emitting radioisotopes of high-density layers 106 and 118 may have sufficient energy to reach such a interface, such that backscattering back into semiconductor substrates 98, moderating layer 116, or absorption layer 122 may be possible. In FIG. 5, an example beta flux vector 132 emitted from high-density layer 106C has sufficient energy to reach the interface between semiconductor substrate 98C and high-density layer 106B. In one example, the transition between semiconductor substrate 98C and high-density layer 106B comprises a transition from a relatively lower density material (silicon carbide) to a relatively higher density material (nickel-63) such that a substantial number of the low-energy beta particles of beta flux vector 132 will be backscattered, as represented by backscattered beta flux vector 134 and some of the beta particles will continue into high-density layer 106B, as represented by beta flux vector 136.

The example beta particle paths described above with respect to beta flux vectors 130, 132, 134, and 136 are merely illustrative of a possible path for low-energy beta particles emitted from high-density layers 106 and 118. However, low-energy beta particles will actually be emitted from high-density layers 106 and 118 in all directions such that an infinite number of beta flux vectors 130, 132, 134, and 136 could have been shown.

Figure 6:
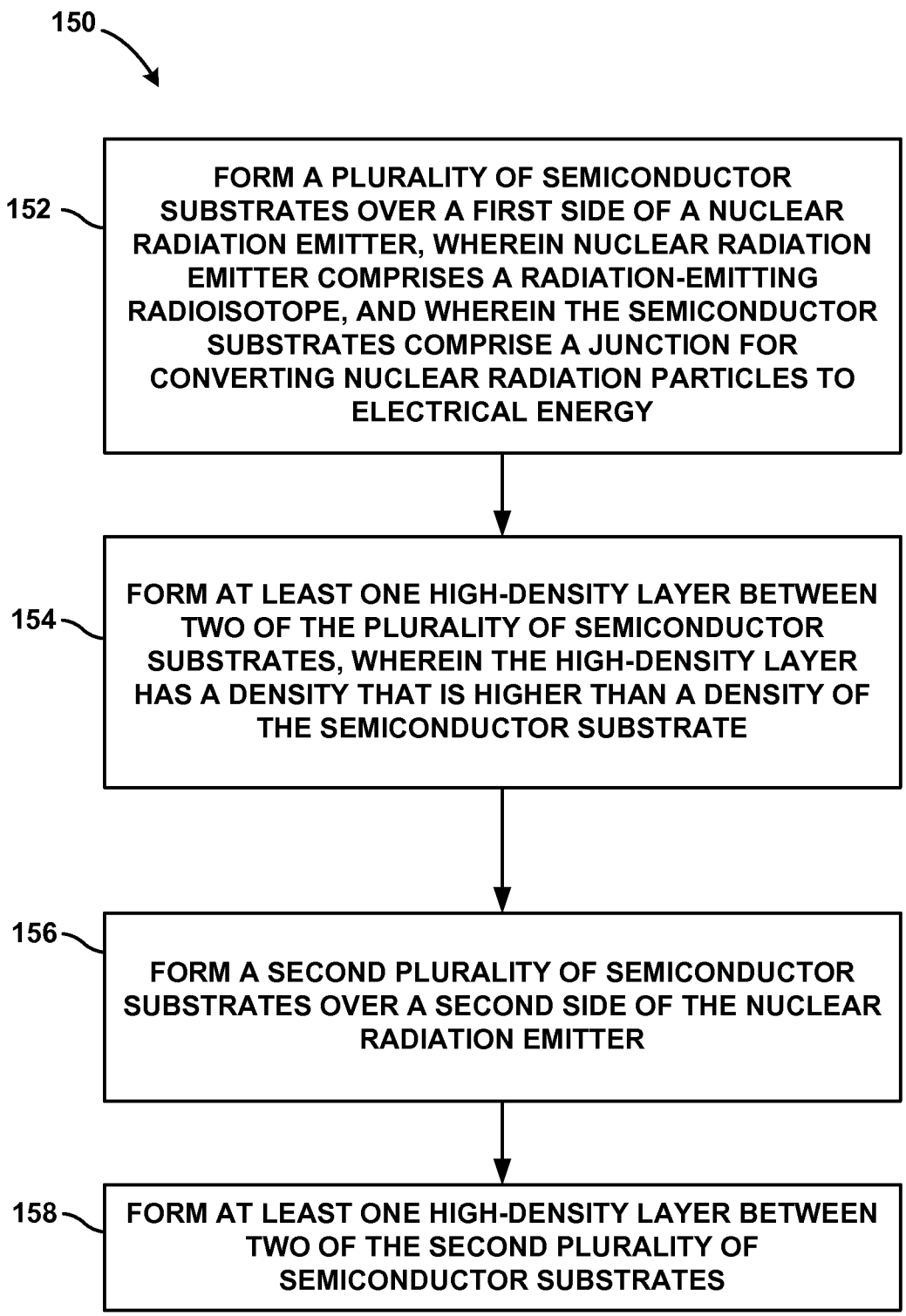
FIG. 6 is a flow diagram showing an example method of making a power converter.

FIG. 6 is a flow diagram illustrating an example method 150 of making a power converter, for example power converter 10 shown in FIG. 1. The example method 150 of FIG. 6 comprises forming a plurality of semiconductor substrates 18A, 18B, 18C, 18D, 18E over a first side 14 of a nuclear radiation emitter 12 (152), wherein nuclear radiation emitter 12 comprises a radiation-emitting radioisotope, and wherein each of the plurality of semiconductor substrates 18 comprises a junction 20 for converting nuclear radiation particles to electrical energy, such as a P-N junction. The example method of FIG. 6 also comprises forming at least one high-density layer 26 between two of the plurality of semiconductor substrates 18 (154), wherein the at least one high-density layer 26 has a density that is higher than a density of semiconductor substrates 18. In one example, the method 150 further comprises forming a second plurality of semiconductor substrates 18F, 18G, 18H, 18K, 18J (FIG. 2) over a second side 16 of nuclear radiation emitter 12 (156), wherein each of the second plurality of semiconductor substrates 18 comprises a junction 20 for converting nuclear radiation particles to electrical energy. The method 150 may also comprise forming at least one high-density layer 26 between two of the second plurality of semiconductor substrates 18F, 18G, 18H, 18K, 18J (158), wherein the at least one second high-density layer 26 has a density that is higher than a density of the semiconductor substrates 18.

In one example, forming at least one high-density layer 26 between two of the first plurality of semiconductor substrates 18A, 18B, 18C, 18D, 18E (154) comprises forming a plurality of high-density layers 26A, 26B, 26C, 26D, 26E, wherein each high-density layer has a density that is higher than a density of semiconductor substrates 18, and wherein each of the high-density layers 26A, 26B, 26C, 26D, 26E is formed on one of the plurality of semiconductor substrates 18A, 18B, 18C, 18D, 18E (e.g., high-density layer 26A is formed on semiconductor substrate 18A, high-density layer 26B is formed on semiconductor substrate 18B, and so on). Similarly, in one example, forming at least one high-density layer 26 between two of the second plurality of semiconductor substrates 18F, 18G, 18H, 18K, 18J (158) comprises forming a plurality of high-density layers 26F, 26G, 26H, 26J, 26K, wherein each high-density layer has a density that is higher than a density of semiconductor substrates 18, and wherein each of the high-density layers 26F, 26G, 26H, 26J, 26K is formed on one of the plurality of semiconductor substrates 18F, 18G, 18H, 18K, 18J (e.g., high-density layer 26F is formed on semiconductor substrate 18F, high-density layer 26G is formed on semiconductor substrate 18G, and so on).

In one example, forming at least one high-density layer 26 between two of the first plurality of semiconductor substrates 18A, 18B, 18C, 18D, 18E (154) comprises forming the at least one high-density layer 26 from a material comprising a nuclear radiation-emitting radioisotope having an energy spectrum that is lower than the energy spectrum of the nuclear radiation-emitting radioisotope of nuclear radiation emitter 12. Similarly, in one example, forming at least one high-density layer 26 between two of the second plurality of semiconductor substrates 18F, 18G, 18H, 18K, 18J (158) comprises forming the at least one high-density layer 26 from a material comprising a nuclear radiation-emitting radioisotope having an energy spectrum that is lower than the energy spectrum of the nuclear radiation-emitting radioisotope of nuclear radiation emitter 12. In one example, the higher energy nuclear radiation emitting radioisotope of nuclear radiation emitter 12 comprises a relatively high energy beta-emitting radioisotope, such as strontium-90 or a composition comprising strontium-90, and the lower energy nuclear radiation-emitting radioisotope of the at least one high-density layer 26 comprises a lower energy beta-emitting radioisotope, such as nickel-63, tritium, or compositions thereof, such as scandium tritide or compositions comprising nickel-63.

Figure 7:
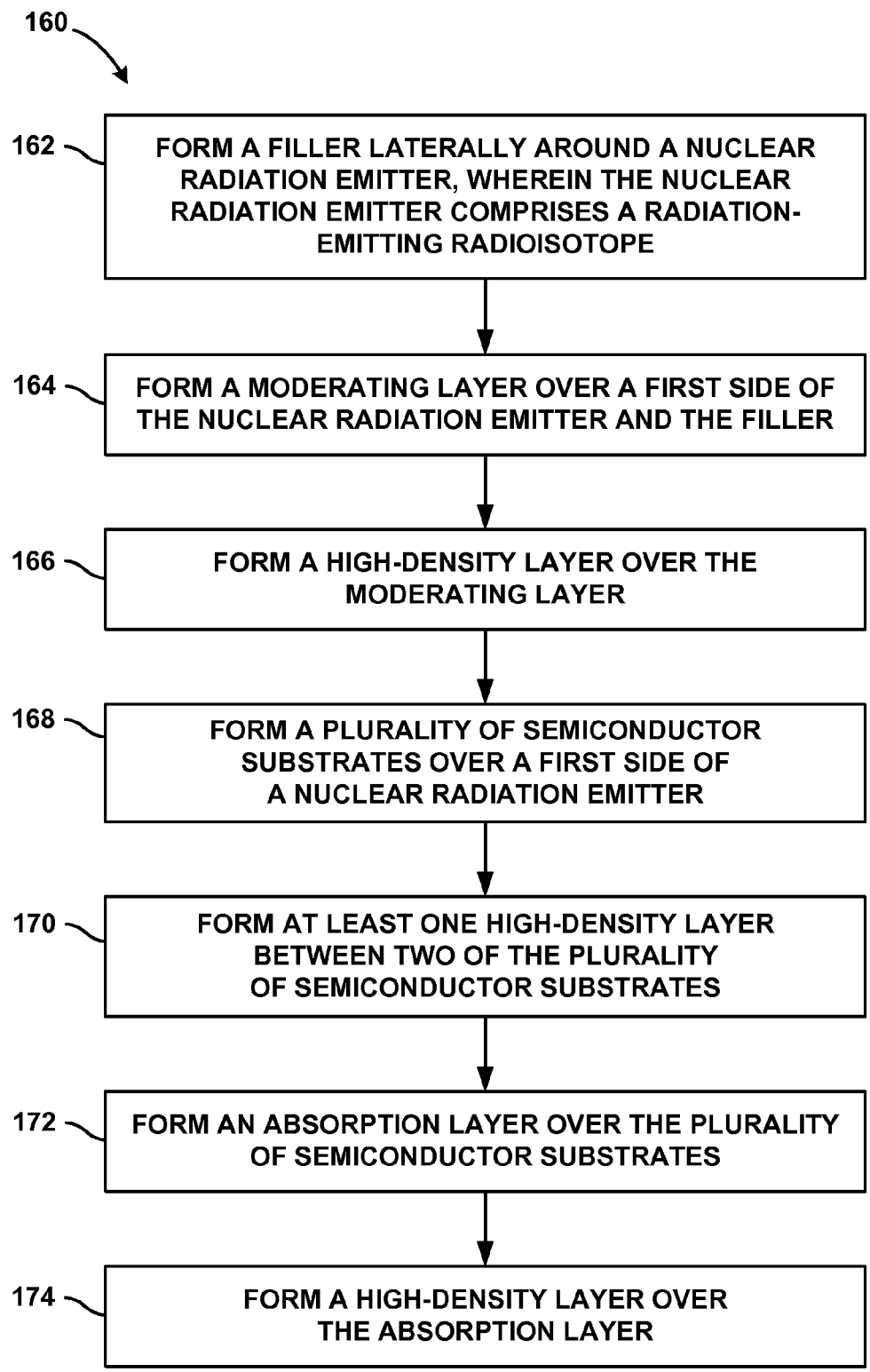
FIG. 7 is a flow diagram showing another example method of making a power converter.

FIG. 7 is a flow diagram illustrating another example method 160 of making a power converter, for example power converter 10 shown in FIG. 1. The example method 160 comprises forming a filler 28 laterally around nuclear radiation emitter 12 (162), forming a moderating layer 36 over a first side 14 of nuclear radiation emitter 12 and a first side 32 of filler 28 (164), and forming a high-density layer 38 over moderating layer 36 (166), wherein high-density layer 38 has a density that is higher than a density of moderating layer 36. The example method 160 may further comprise forming a plurality of semiconductor substrates 18A, 18B, 18C, 18D, 18E over first side 14 of nuclear radiation emitter 12 and a first side 32 of filler 28 (168), such as by forming the plurality of semiconductor substrates 18 over high-density layer 38 and moderating layer 36. The example method 160 may also comprise forming at least one high-density layer 26 between two of the plurality of semiconductor substrates 18 (170). The example method 160 may also comprise forming an absorption layer 44 over the plurality of semiconductor substrates 18 (172), and forming a high-density layer 46 over absorption layer 44 (174), wherein high-density layer 46 has a density that is higher than a density of the absorption layer.

Figure 8:
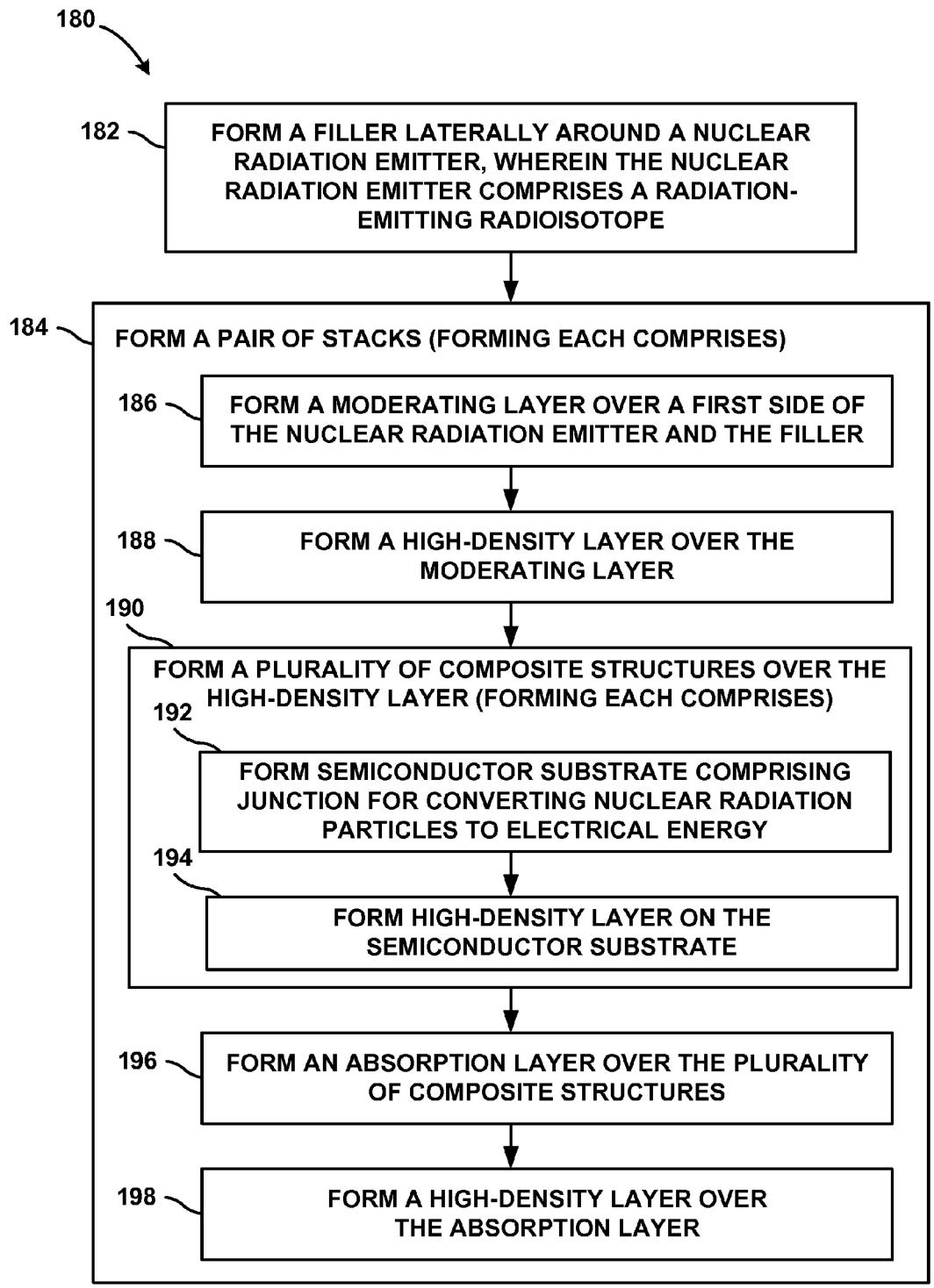
FIG. 8 is a flow diagram showing another example method of making a power converter.

FIG. 8 is a flow diagram illustrating another example method 180 of making a power converter, for example power converter 50 shown in FIG. 2 or power converter 90 shown in FIG. 4. The example method 180 comprises forming a filler 28 laterally around a beta emitter 12 (182), wherein beta emitter 12 comprises a beta-emitting radioisotope, and forming a pair of stacks 52A, 52B (184), wherein a first one of the pair of stacks 52A is formed over a first side 14 of beta emitter 12 and a first side 32 of filler 28 and a second one of the pair of stacks 52B is formed over a second side 16 of beta emitter 12 and a second side 34 of filler 28. Forming each of the stacks (184) comprises forming a moderating layer 54A, 54B over beta emitter 12 and filler 28 (186), forming a high-density layer 56A, 56B over moderating layer 54A, 54B (188), wherein high-density layer 56A, 56B has a density that is higher than a density of moderating layer 54A, 54B, forming a plurality of composite structures 40 over high-density layer 56A, 56B (190), wherein forming each of the plurality of composite structures 40 (190) comprises forming a semiconductor substrate 18 comprising a junction 20 for converting nuclear radiation particles to electrical energy (192) and forming a high-density layer 26 on semiconductor substrate 18 (194), wherein each high-density layer 26 has a density that is higher than a density of the semiconductor substrate. The example method 180 may also comprise forming an absorption layer 58A, 58B over the plurality of composite structures 40 (196), and forming a high-density layer 60A, 60B over absorption layer 58A, 58B (198), wherein high-density layer 60A, 60B has a density that is higher than a density of the absorption layer.

In one example, forming a high-density layer 26 on at least one of the semiconductor substrates 18 while forming at least one of the composite structures 40 (194) comprises forming the at least one high-density layer 26 from a material comprising a beta-emitting radioisotope having an energy spectrum that is lower than the energy spectrum of the beta-emitting radioisotope of beta emitter 12. In one example, forming high-density layer 56A, 56B on moderating layer 54A, 54B (188) comprises forming high-density layer 56A, 56B from a material comprising a beta-emitting radioisotope having an energy spectrum that is lower than the energy spectrum of the beta-emitting radioisotope of beta emitter 12. In one example, forming a high-density layer on a semiconductor substrate 18 of all of the composite structures 40 (194) comprises forming the at least one high-density layer 26 from a material comprising a beta-emitting radioisotope having an energy spectrum that is lower than the energy spectrum of the beta-emitting radioisotope of beta emitter 12. In one example, the higher energy beta-emitting radioisotope of beta emitter 12 comprises strontium-90 or a composition comprising strontium-90, and the lower energy beta-emitting radioisotope of the high density layer 26, 56A, 56B comprises at least one of nickel-63, tritium, or compositions thereof, such as scandium tritide or compositions comprising nickel-63.

This disclosure refers to illustrative examples that are not meant to be construed in a limiting sense. Various modifications of the illustrative examples, as well as additional examples in line with the disclosure, will be apparent to persons skilled in the art upon reference to this description. Any specific numerical value or range described in the foregoing disclosure shall not be limiting, except for values or ranges included in the following claims.

The invention claimed is:

1. A power converter comprising:
    a nuclear radiation emitter having a first side and a second side, wherein the nuclear radiation emitter comprises a radiation-emitting radioisotope;
    a plurality of semiconductor substrates disposed over the first side of the nuclear radiation emitter, wherein each of the plurality of semiconductor substrates comprises a junction for converting nuclear radiation particles to electrical energy;
    at least one high-density layer, wherein the at least one high density layer has a density that is higher than a density of the plurality of semiconductor substrates, wherein the at least one high-density layer is disposed between two of the plurality of semiconductor substrates; and
    a moderating layer disposed between the nuclear radiation emitter and the plurality of semiconductor substrates, wherein a composition of the moderating layer is such that the moderating layer acts to truncate nuclear radiation particles emitted from the nuclear radiation emitter having an energy above a predetermined threshold, wherein the predetermined threshold of the moderating layer is about 0.5 MeV.

2. The power converter of claim 1, wherein the nuclear radiation-emitting radioisotope comprises a beta-emitting radioisotope.

3. The power converter of claim 2, wherein the beta-emitting radioisotope comprises strontium-90.

4. The power converter of claim 1, wherein the nuclear radiation-emitting radioisotope has an average energy output of at least about 0.1 MeV.

5. The power converter of claim 1, wherein the high-density layer comprises a radiation-emitting radioisotope having an energy spectrum that is lower than an energy spectrum of the radiation-emitting radioisotope of the nuclear radiation emitter, and wherein the radiation-emitting radioisotope of the high-density layer has an average energy output of less than about 0.1 MeV.

6. The power converter of claim 5, wherein the radiation-emitting radioisotope of the high-density layer comprises at least one of nickel-63, tritium, a compound comprising nickel-63, and a compound comprising tritium.

7. The power converter of claim 1, further comprising a filler disposed laterally around the nuclear radiation emitter, the filler having a first side and a second side, wherein the plurality of semiconductor substrates is also disposed over the first side of the filler, wherein a composition of the filler is such that the filler absorbs substantially all nuclear radiation particles laterally emitted from the nuclear radiation emitter.

8. The power converter of claim 1, wherein the at least one high-density layer comprises a plurality of high-density layers each having a density that is higher than a density of the semiconductor substrates, wherein each high density layer of the plurality of high density layers is disposed on a respective one of the plurality of semiconductor substrates.

9. The power converter of claim 1, further comprising:
    a filler disposed laterally around the nuclear radiation emitter;
    the moderating layer disposed over the nuclear radiation emitter and the filler; and
    an absorption layer disposed over the plurality of semiconductor substrates, the at least one high density layer, the moderating layer, and the filler, wherein the density of the higher density layer is greater than a density of the absorption layer.

10. The power converter of claim 1, wherein the plurality of semiconductor substrates includes a first semiconductor substrate defining an upper surface between the nuclear radiation emitter and the at least one high density layer, and wherein the at least one high density layer is disposed directly on substantially all of the upper surface of the first semiconductor substrate.

11. The power converter of claim 1, wherein the density of the at least one high-density layer relative to the density of the plurality of semiconductor substrates is such that at least a portion of nuclear radiation particles emitted from the nuclear radiation emitter are backscattered at a transition from a respective layer of the plurality of semiconductor substrates to the at least one high-density layer.

12. The power converter of claim 1, wherein the density of the at least one high density layer is about 3.82 times or greater than that of the density of the plurality of semiconductor substrates.

13. The power convertor of claim 1, wherein the density of the at least one high density layer is about 6 to about 8.25 times greater than that of the density of the plurality of semiconductor substrates.

14. The power convertor of claim 1, wherein the at least one high density layer comprises at least one of tungsten, germanium, gold, platinum, lead, iridium, and osmium, or alloys thereof.

15. A method of making a power converter, the method comprising:
    forming a plurality of semiconductor substrates over a first side of a nuclear radiation emitter;
    wherein the nuclear radiation emitter comprises a radiation-emitting radioisotope, and wherein each of the plurality of semiconductor substrates comprises a junction for converting nuclear radiation particles to electrical energy;
    forming at least one high-density layer between two of the plurality of semiconductor substrates, wherein the at least one high-density layer has a density that is higher than a density of the plurality of semiconductor; and
    forming a moderating layer disposed between the nuclear radiation emitter and the plurality of semiconductor substrates, wherein a composition of the moderating layer is such that the moderating layer acts to truncate nuclear radiation particles emitted from the nuclear radiation emitter having an energy above a predetermined threshold, wherein the predetermined threshold of the moderating layer is about 0.5 MeV.

16. The method of claim 15, wherein the nuclear radiation-emitting radioisotope comprises a beta-emitting radioisotope.

17. The method of claim 16, wherein the beta-emitting radioisotope comprises strontium-90.

18. The method of claim 15, wherein the high-density layer comprises a radiation-emitting radioisotope having an energy spectrum that is lower than an energy spectrum of the radiation-emitting radioisotope of the nuclear radiation emitter, and wherein the radiation-emitting radioisotope of the high-density layer has an average energy output of less than about 0.1 MeV.

* * * * *

UNITED STATES PATENT AND TRADEMARK OFFICE
CERTIFICATE OF CORRECTION

| | | |
|---|---|---|
| PATENT NO. | : 9,006,955 B2 | Page 1 of 1 |
| APPLICATION NO. | : 13/286865 | |
| DATED | : April 14, 2015 | |
| INVENTOR(S) | : Geoffrey D. Batchelder et al. | |

It is certified that error appears in the above-identified patent and that said Letters Patent is hereby corrected as shown below:

In the claims

Col. 22, claim 15, lines 61-64 delete "forming at least one high-density layer between two of the plurality of semiconductor substrates, wherein the at least one high-density layer has a density that is higher than a density of the plurality of semiconductor ; and"

and insert in place thereof

--forming at least one high-density layer between two of the plurality of semiconductor substrates, wherein the at least one high-density layer has a density that is higher than a density of the plurality of semiconductor substrates; and--.

Signed and Sealed this
Nineteenth Day of April, 2016

Michelle K. Lee
*Director of the United States Patent and Trademark Office*